US012604492B2

(12) United States Patent
Byeon et al.

(10) Patent No.: US 12,604,492 B2
(45) Date of Patent: Apr. 14, 2026

(54) SEMICONDUCTOR DEVICE INCLUDING AN ACTIVE PATTERN

(71) Applicant: SAMSUNG ELECTRONICS CO., LTD., Suwon-si (KR)

(72) Inventors: Hyohoon Byeon, Suwon-si (KR); Seokhoon Kim, Suwon-si (KR); Yuyeong Jo, Suwon-si (KR); Pankwi Park, Suwon-si (KR); Sungkeun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/513,853

(22) Filed: Nov. 20, 2023

(65) Prior Publication Data

US 2024/0387717 A1 Nov. 21, 2024

(30) Foreign Application Priority Data

May 16, 2023 (KR) ........................ 10-2023-0063305

(51) Int. Cl.
H10D 30/43 (2025.01)
H10D 30/01 (2025.01)
(Continued)

(52) U.S. Cl.
CPC ........... H10D 30/43 (2025.01); H10D 30/014 (2025.01); H10D 30/6729 (2025.01);
(Continued)

(58) Field of Classification Search
CPC .. H10D 30/43; H10D 30/014; H10D 30/6729; H10D 30/6735; H10D 30/6757;
(Continued)

(56) References Cited

U.S. PATENT DOCUMENTS 8,936,972 B2 1/2015 Bangsaruntip et al.
9,660,033 B1 5/2017 Chen et al.
(Continued)

FOREIGN PATENT DOCUMENTS

CN 115528089 12/2022

OTHER PUBLICATIONS

S. Mochizuki et al., Structural and Electrical Demonstration of SiGe Cladded Channel for PMOS Stacked Nanosheet Gate-All-Around Devices, 2020 IEEE Symposium on VLSI Technology.
(Continued)

*Primary Examiner* — Jay C Kim
*Assistant Examiner* — Woo K Lee
(74) *Attorney, Agent, or Firm* — Morgan, Lewis & Bockius LLP

(57) ABSTRACT

A semiconductor device includes: a substrate including an active pattern; a first channel structure overlapping the active pattern; a gate electrode including an electrode portion between the active pattern and the first channel structure; a semiconductor layer contacting the first channel structure; and a source/drain pattern contacting the first channel structure, wherein the first channel structure includes: a first upper channel layer; a first lower channel layer; and a first intervening channel layer disposed between the first upper channel layer and the first lower channel layer, wherein the semiconductor layer contacts a sidewall of the first upper channel layer, a sidewall of the first lower channel layer, and a sidewall of the first intervening channel layer, and wherein the semiconductor layer and the first intervening channel layer include a semiconductor material that is different from a semiconductor material of the first upper channel layer and the first lower channel layer.

20 Claims, 27 Drawing Sheets

(51) Int. Cl.
  *H10D 30/67* (2025.01)
  *H10D 62/10* (2025.01)
  *H10D 62/13* (2025.01)
  *H10D 64/01* (2025.01)
(52) U.S. Cl.
  CPC ..... *H10D 30/6735* (2025.01); *H10D 30/6757* (2025.01); *H10D 62/121* (2025.01); *H10D 62/151* (2025.01); *H10D 64/017* (2025.01); *H10D 64/018* (2025.01)
(58) Field of Classification Search
  CPC .. H10D 62/121; H10D 62/151; H10D 64/017; H10D 64/018
  See application file for complete search history.

(56) References Cited

U.S. PATENT DOCUMENTS

| | | | |
|---|---|---|---|
| 10,170,549 B2 | 1/2019 | Kittl et al. | |
| 10,510,871 B1 | 12/2019 | More et al. | |
| 10,693,017 B2 | 6/2020 | Lee et al. | |
| 10,818,775 B2 | 10/2020 | Reboh et al. | |
| 2020/0075593 A1 | 3/2020 | Xiao | |
| 2020/0105750 A1 | 4/2020 | Xiao | |
| 2023/0060784 A1 | 3/2023 | Liu et al. | |

OTHER PUBLICATIONS

S. Mochizuki et al., "Stacked Gate-All-Around Nanosheet pFET with Highly Compressive Strained Si1-xGex Channel", 2020 IEEE International Electron Devices Meeting (IEDM).

Sarunya Bangsaruntip et al., "High performance and highly uniform gate-all-around silicon nanowire MOSFETs with wire size dependent scaling", 2009 IEEE, pp. 1-4.

Isaac Lauer et al., "Si nanowire CMOS fabricated with minimal deviation from RMG FinFET technology showing record performance", 2015 Symposium on VLSI Technology Digest of Technical Papers.

S. D. Kim et al., "Performance trade-offs in FinFET and gate-all-around device architectures for 7nm-node and beyond", 2015 IEEE SOI-3D-Subthreshold Microelectronics Technology Unified Conference (S3S).

H. Mertens et al., "Gate-all-around MOSFETs based on vertically stacked horizontal Si nanowires in a replacement metal gate process on bulk Si substrates", 2016 IEEE Symposium on VLSI Technology.

B. Geumjong et al., "3nm GAA Technology featuring Multi-Bridge-Channel FET for Low Power and High Performance Applications", 2018 IEEE International Electron Devices Meeting (IEDM).

D. Guo et al., "FINFET technology featuring high mobility SiGe channel for 10nm and beyond", 2016 IEEE Symposium on VLSI Technology.

N. Loubet et al., "Stacked nanosheet gate-all-around transistor to enable scaling beyond FinFET", 2017 Symposium on VLSI Technology.

Ishii, Y., et al., "Low Temperature Plasma Process for Si/SiGe Dual Channel Fin Application", Electron Devices Technology and Manufacturing Conference (EDTM), IEEE pp. 124-126, 2019.

Khiangte, L. and R. S. Dhar, "TCAD Modelling of 30nm Strained-Si/SiGe/Si Channel MOSFET", Devices for Integrated Circuit (DevIC), IEEE. pp.295-297, 2019.

Shima, M., et al. "High drive current NMOS with Si—SiGe heterostructure low electric field channel", IEEE Electron Device Letters vol. 25, 10, pp. 699-701, 2004.

Dhar, R. S., et al., "Analysis of Capacitance-Voltage Characteristics for Ultrathin Si/SiGe/Si Hetero-Layered MOS Structure", Advances in Bioinformatics, Multimedia, and Electronics Circuits and Signals, Springer: 83-89, 2020.

Cheng, Z., et al. "SiGe-on-insulator (SGOI): Two structures for CMOS application", Department of Materials Science and Engineering, Massachusetts Institute of Technology, 2003.

Collaert, N., et al. "High-performance strained Si/SiGe pMOS devices with multiple quantum wells", IEEE Transactions on nanotechnology vol. 1, 4, pp. 190-194, 2002.

B. Bindu, N. DasGupta and A. DasGupta, "Analytical model of drain current of Si/SiGe heterostructure p-channel MOSFETs for circuit simulation", IEEE Trans. Electron Devices, vol. 53, 6, pp. 1411-1419, 2006.

Wang, M.-C., et al., "Strained pMOSFETs with SiGe channel and embedded SiGe source/drain stressor under heating and hot-carrier stresses", 2013 International Symposium on Next-Generation Electronics, IEEE.

Zhonghai Shi, et al., "Simulation and optimization of strained Si1-xGex buried channel p-MOSFETs", Solid-State Electronics 44 (2000) 1223-1228.

Yu, S., et al., (2004), "Strained-Si-strained-SiGe dual-channel layer structure as CMOS substrate for single workfunction metal-gate technology", IEEE Electron Device Letters 25(6): 402-404.

Z. Cheng, M. T. Currie, C. W. Leitz, G. Taraschi, E. A. Fitzgerald, J. L. Hoyt, and D. A. Antoniadis, "Electron mobility enhancement in strained-Si nMOSFET's fabricated on SiGe-on-Insulator (SGOI) substrates", IEEE Electron Device Letters, vol. 22, No. 7, pp. 321-323, 2001.

Olsen, S. H., et al. (2004), "Study of single-and dual-channel designs for high-performance strained-Si—SiGe n-MOSFETs", IEEE transactions on electron devices 51(8): 1245-1253.

FIG. 4A

SEMICONDUCTOR DEVICE INCLUDING AN ACTIVE PATTERN

CROSS-REFERENCE TO RELATED APPLICATION

This U.S. nonprovisional application claims priority under 35 U.S.C. § 119 to Korean Patent Application No. 10-2023-0063305 filed on May 16, 2023 in the Korean Intellectual Property Office, the disclosure of which is incorporated by reference herein in its entirety.

TECHNICAL FIELD

The present inventive concept relates to a semiconductor device, and more particular, to a semiconductor device including an active pattern.

DISCUSSION OF THE RELATED ART

A semiconductor device includes an integrated circuit including metal oxide semiconductor field effect transistors (MOSFETs). As size and design rule of the semiconductor device are gradually decreased, sizes of the MOSFETs are also increasingly scaled down. The scale down of MOSFETs may deteriorate operating characteristics of the semiconductor device. Accordingly, the semiconductor device has been under development to increase performance while overcoming limitations due to integration of the semiconductor device.

SUMMARY

According to some embodiments of the present inventive concept, a semiconductor device includes: a substrate that includes an active pattern; a first channel structure that overlaps the active pattern; a gate electrode that includes an electrode portion disposed between the active pattern and the first channel structure; a semiconductor layer that is in contact with the first channel structure; and a source/drain pattern in contact with the first channel structure, wherein the first channel structure includes: a first upper channel layer; a first lower channel layer; and a first intervening channel layer disposed between the first upper channel layer and the first lower channel layer, wherein the semiconductor layer is in contact with a first upper sidewall of the first upper channel layer, a first lower sidewall of the first lower channel layer, and a first intervening sidewall of the first intervening channel layer, and wherein each of the semiconductor layer and the first intervening channel layer includes a semiconductor material that is different from a semiconductor material of each of the first upper channel layer and the first lower channel layer.

According to some embodiments of the present inventive concept, a semiconductor device includes: a substrate that includes an active pattern; a plurality of source/drain patterns that overlap the active pattern and are adjacent to each other; a first channel structure disposed between the source/drain patterns; a gate electrode that includes a first electrode portion that is disposed between the active pattern and the first channel structure; and a semiconductor layer that is in contact with the first channel structure and the source/drain patterns, wherein the first channel structure includes: a first lower channel layer; a first intervening channel layer disposed on a top surface of the first lower channel layer; and a first upper channel layer disposed on a top surface of the first intervening channel layer, wherein the semiconductor layer and the first intervening channel layer include a semiconductor material different from a semiconductor material of the first upper channel layer and the first lower channel layer, and wherein the first upper channel layer and the first lower channel layer are spaced apart from each other.

According to some embodiments of the present inventive concept, a semiconductor device includes: a substrate that includes an active pattern; a plurality of source/drain patterns that overlap the active pattern and are adjacent to each other in a first direction; a channel structure disposed between the source/drain patterns; a gate electrode that includes an electrode portion that is disposed between the active pattern and the channel structure; a semiconductor layer in contact with the channel structure and the source/drain patterns; a gate dielectric layer disposed between the gate electrode and the semiconductor layer; an active contact electrically connected to the source/drain pattern, wherein the channel structure includes: a lower channel layer; an upper channel layer; and an intervening channel layer disposed between the lower channel layer and the upper channel layer, wherein each of the semiconductor layer and the intervening channel layer include silicon, wherein each of the upper channel layer and the lower channel layer include silicon-germanium, and wherein each of a width in the first direction of the upper channel layer and a width in the first direction of the lower channel layer is less than a width in the first direction of the intervening channel layer.

BRIEF DESCRIPTION OF DRAWINGS

FIG. 4A illustrates a plan view showing a semiconductor device according to some embodiments of the present inventive concept.

DETAILED DESCRIPTION OF EMBODIMENTS

Figure 1:
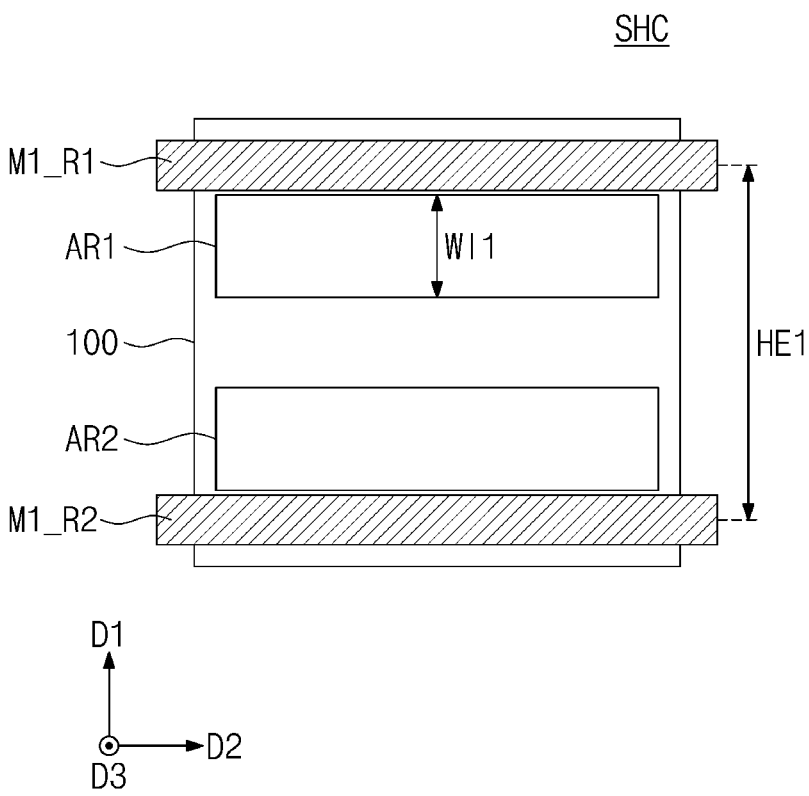
FIGS. 1, 2 and 3 illustrate conceptual diagrams showing logic cells of a semiconductor device according to some embodiments of the present inventive concept.
Figure 2:
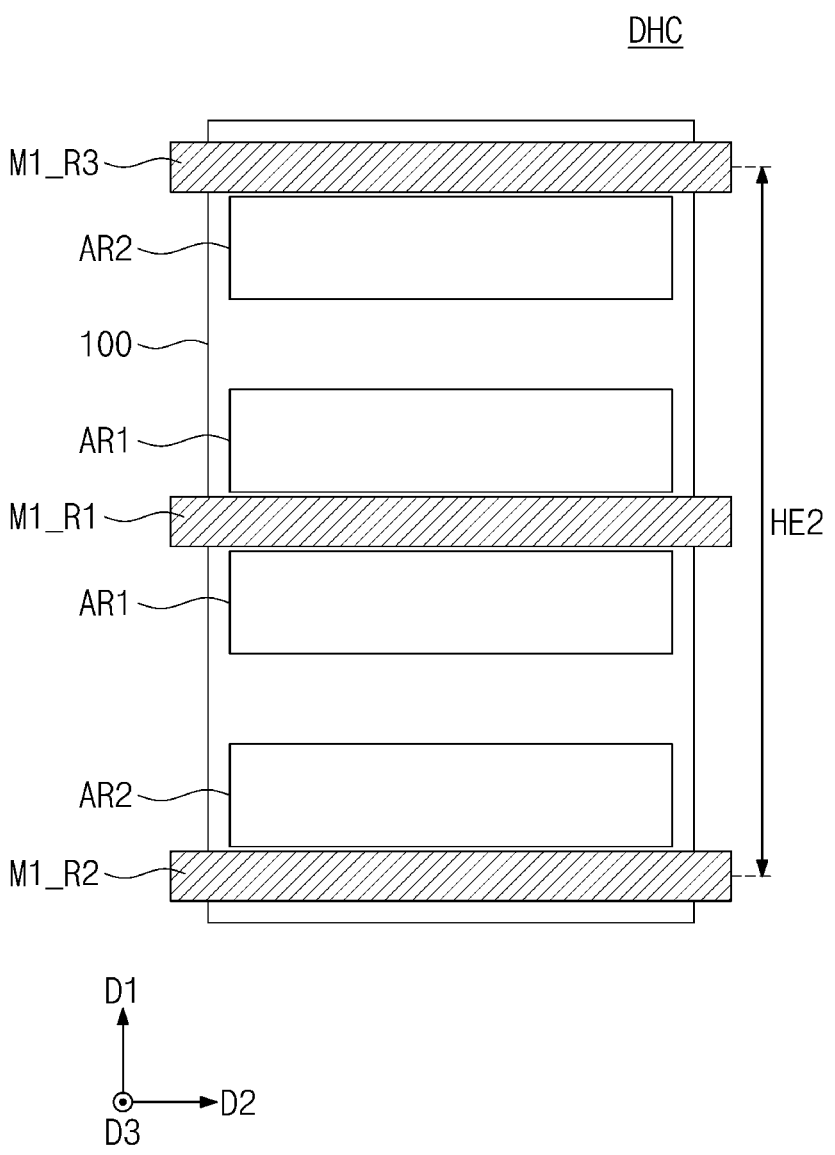
Figure 3:
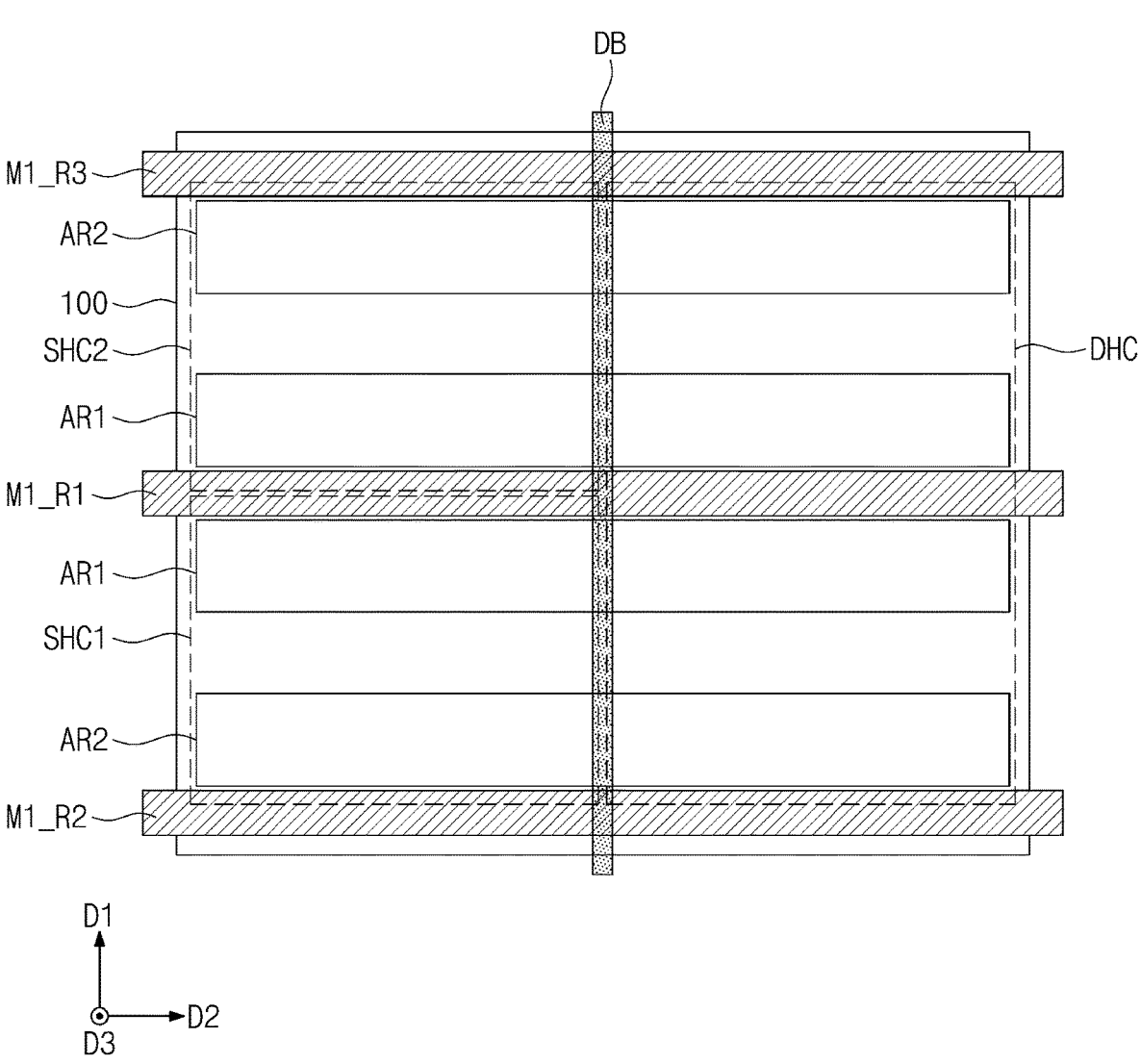

FIGS. 1 to 3 illustrate conceptual diagrams showing logic cells of a semiconductor device according to some embodiments of the present inventive concept.

Referring to FIG. 1, a single height cell SHC may be provided. For example, a substrate 100 may be provided with a first power line M1_R1 and a second power line M1_R2. A third power line M1_R3 may be a path for providing a source voltage (VSS). For example, the first power line M1_R1 may be a path for providing a ground voltage. The second power line M1_R2 may be a path for providing a drain voltage (VDD). For example, the second power line M1_R2 may be a path for providing a power voltage.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. The single height cell SHC may have a complementary metal oxide semiconductor (CMOS) structure provided between the first power line M1_R1 and the second power line M1_R2.

Each of the first and second active regions AR1 and AR2 may have a first width WII in a first direction D1. A first height HE1 may be defined as a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may be a logic device, such as AND, OR, XOR, XNOR, and inverter, that performs a specific function. The logic cell may include transistors for constituting a logic device and wiring lines for connecting the transistors to each other.

Referring to FIG. 2, a double height cell DHC may be provided. For example, a substrate 100 may be provided with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage (VSS).

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may be defined to indicate a length in the first direction D1 of the double height cell DHC. The second height HE2 may be about twice the length of the first height HE1 of FIG. 1. The two first active regions AR1 of the double height cell DHC may be collectively connected together to act as one active region.

The double height cell DHC shown in FIG. 2 may be defined as a multi-height cell. In some embodiments of the present inventive concept, the multi-height cell may include a triple height cell whose cell height is about three times that of the single height cell SHC.

Referring to FIG. 3, a substrate 100 may be provided with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4A:
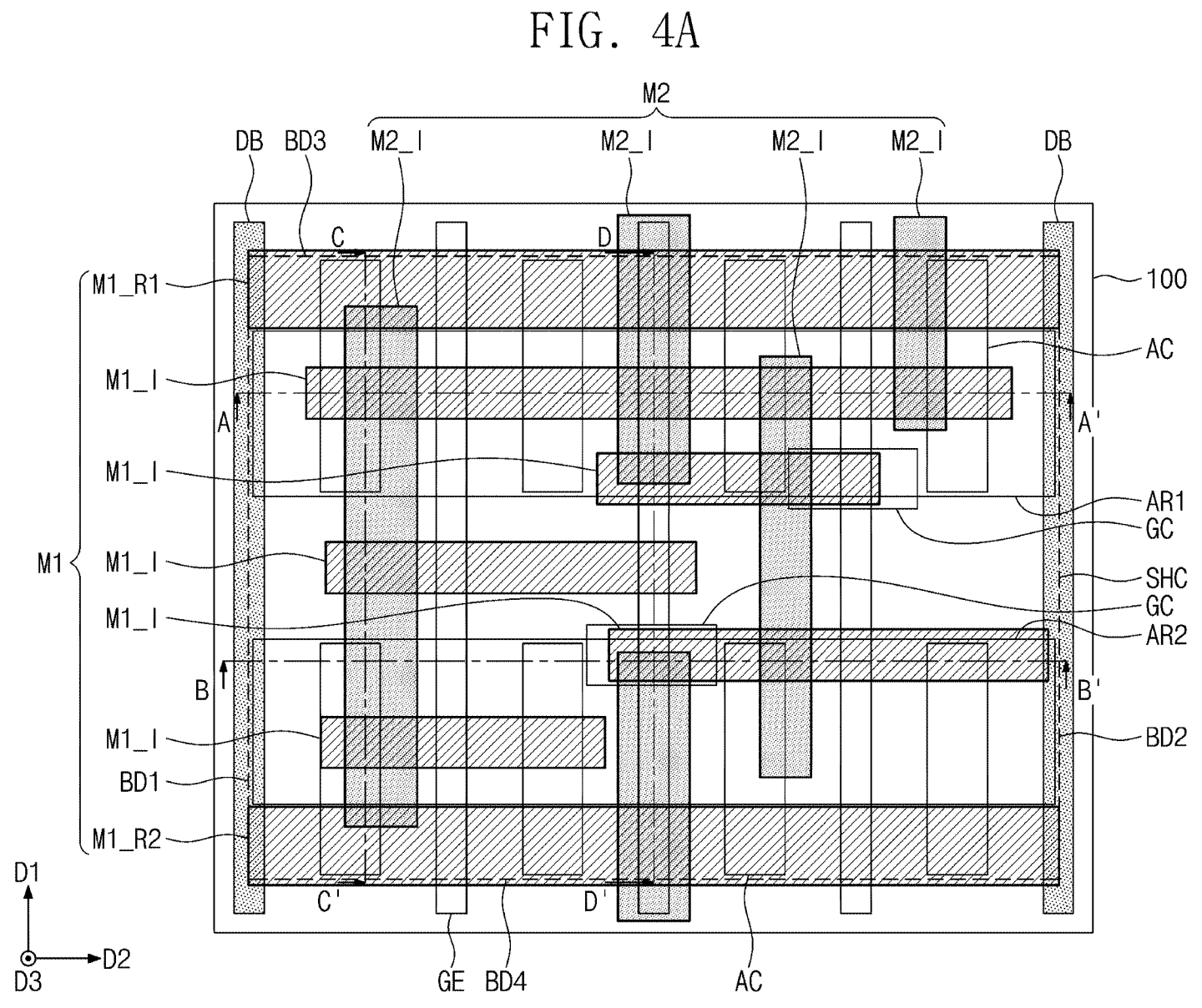
Figure 4B:
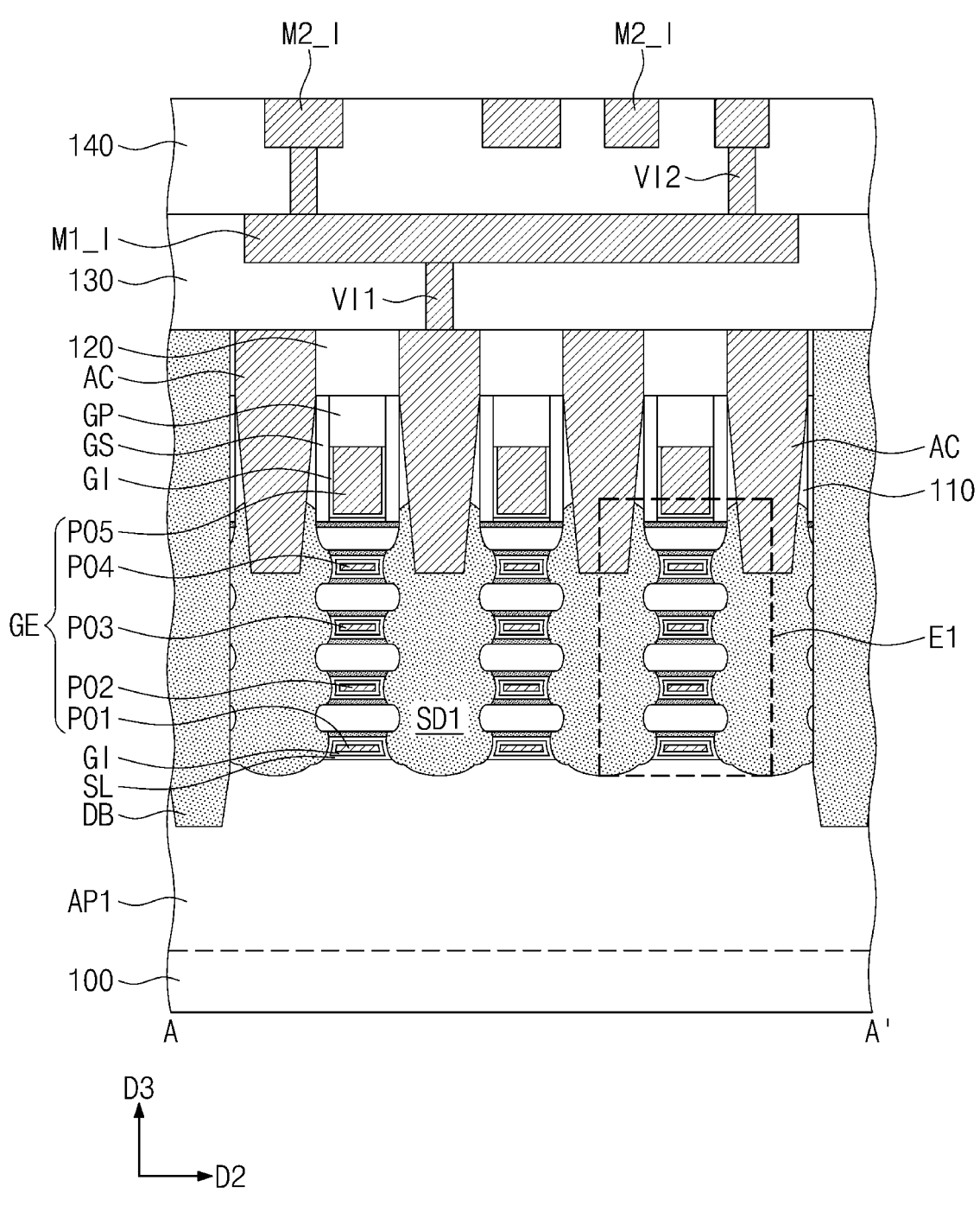
FIG. 4B illustrates a cross-sectional view taken along line A-A' of FIG. 4A.
Figure 4C:
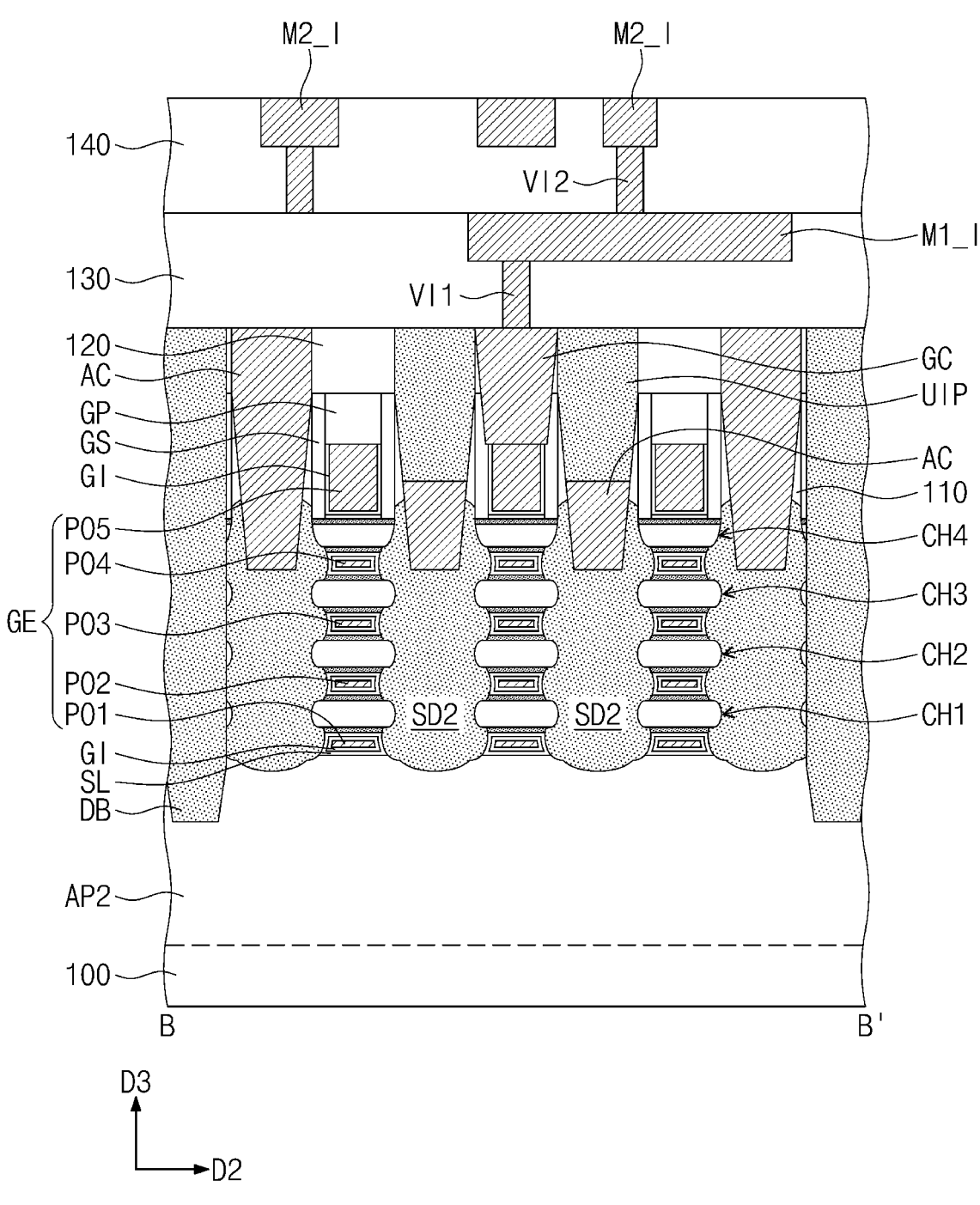
FIG. 4C illustrates a cross-sectional view taken along line B-B' of FIG. 4A.
Figure 4D:
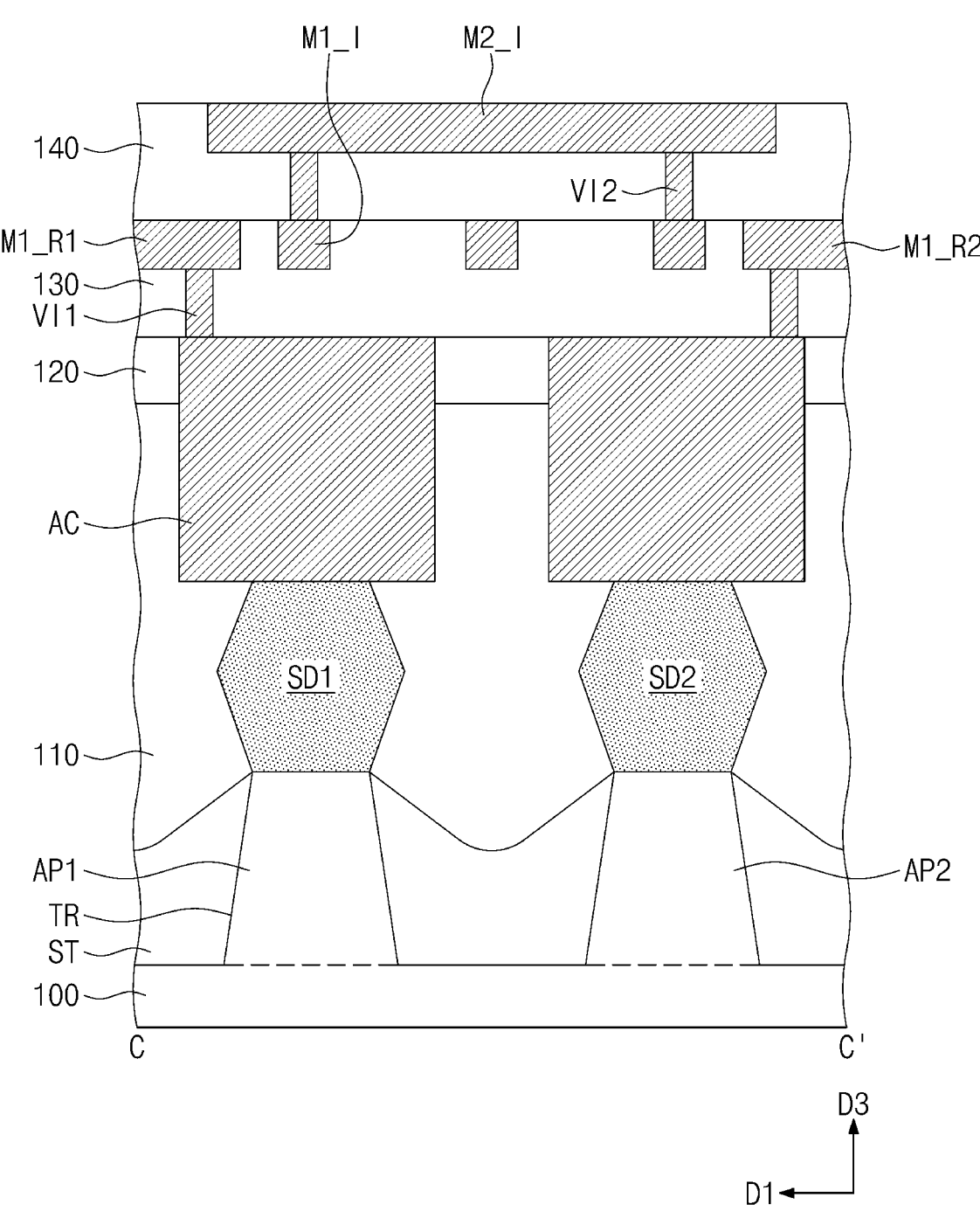
FIG. 4D illustrates a cross-sectional view taken along line C-C' of FIG. 4A.
Figure 4E:
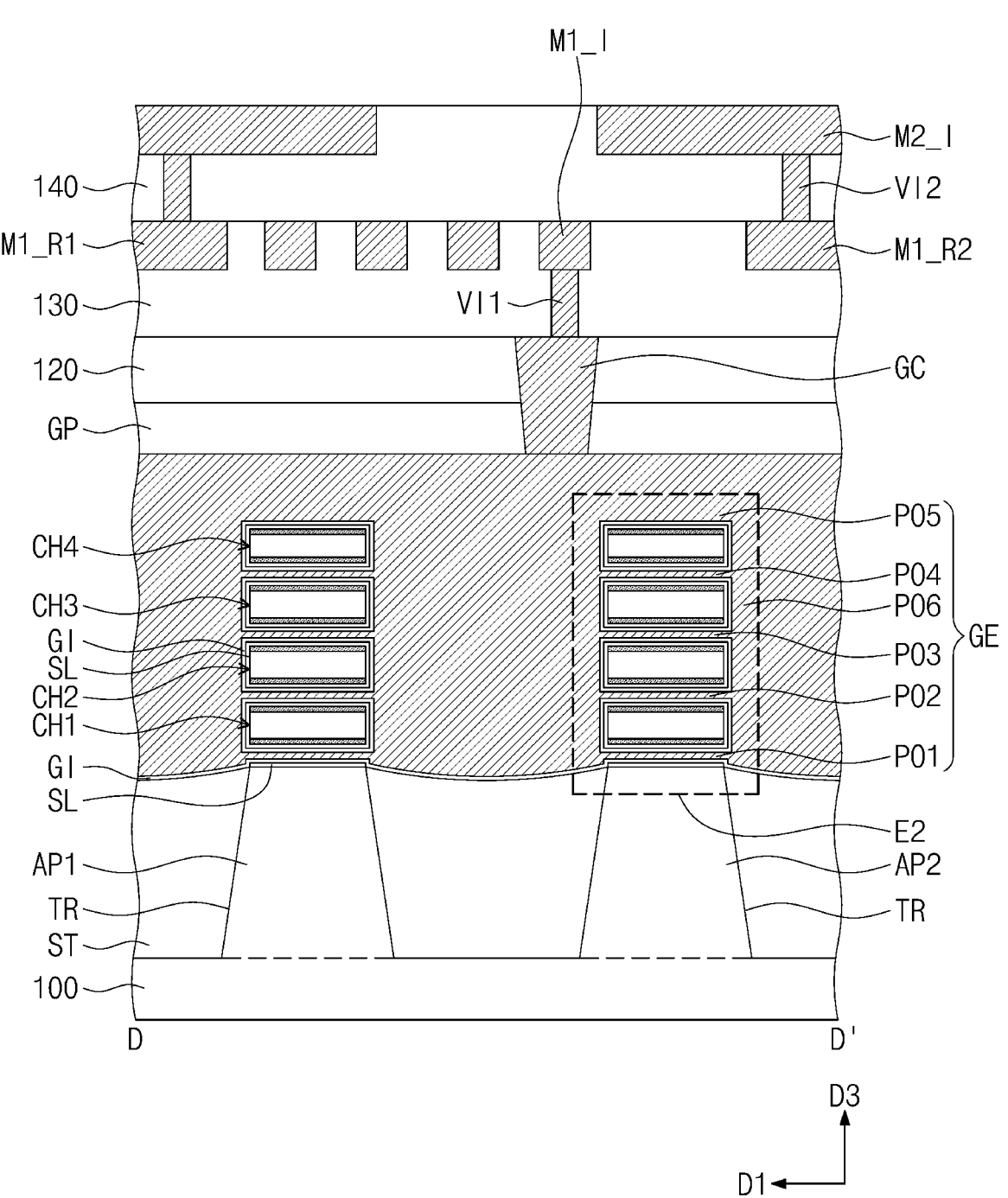
FIG. 4E illustrates a cross-sectional view taken along line D-D' of FIG. 4A.
Figure 4F:
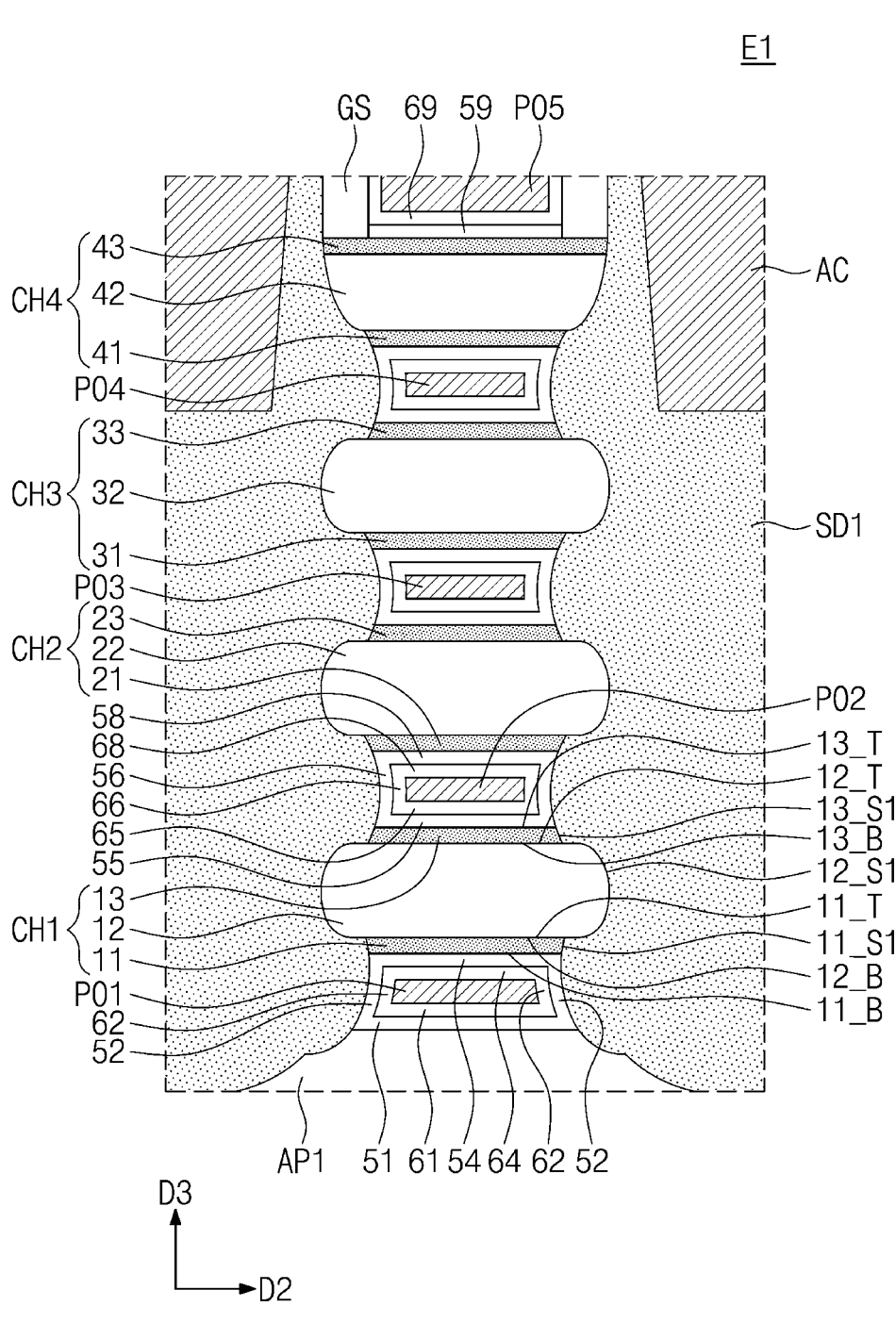
FIG. 4F illustrates an enlarged view showing section E1 of FIG. 4B.
Figure 4G:
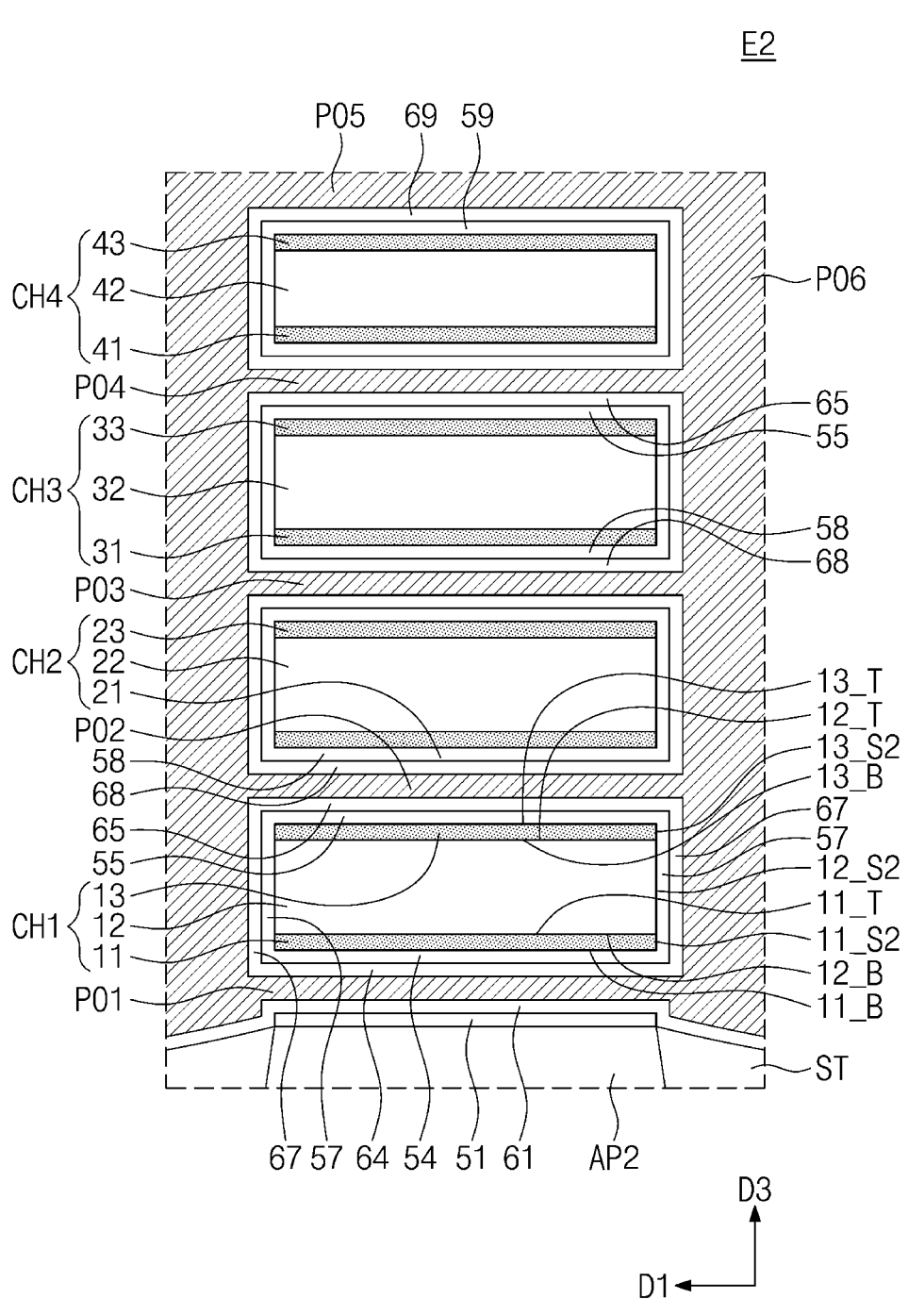
FIG. 4G illustrates an enlarged view showing section E2 of FIG. 4E.

FIG. 4A illustrates a plan view showing a semiconductor device according to some embodiments of the present inventive concept. FIG. 4B illustrates a cross-sectional view taken along line A-A' of FIG. 4A. FIG. 4C illustrates a cross-sectional view taken along line B-B' of FIG. 4A. FIG. 4D illustrates a cross-sectional view taken along line C-C' of FIG. 4A. FIG. 4E illustrates a cross-sectional view taken along line D-D' of FIG. 4A. FIG. 4F illustrates an enlarged view showing section E1 of FIG. 4B. FIG. 4G illustrates an enlarged view showing section E2 of FIG. 4E.

Referring to FIGS. 4A to 4E, a semiconductor device may include a substrate 100. A single height cell SHC may be provided on the substrate 100. A logic cell may be disposed on the single height cell SHC. In some embodiments of the present inventive concept, the substrate 100 may be a semiconductor substrate. For example, the substrate 100 may include silicon (Si), germanium (Ge), silicon-germanium (SiGe), gallium phosphide (GaP), or gallium arsenide (GaAs). In some embodiments of the present inventive concept, the substrate 100 may be a silicon-on-insulator (SOI) substrate or a germanium-on-insulator (GOI) substrate. The substrate 100 may have, for example, a plate shape that extends along a plane elongated in a first direction D1 and a second direction D2. The first direction D1 and the second direction D2 may intersect each other. For example, the first direction D1 and the second direction D2 may be horizontal directions that are orthogonal to each other.

In some embodiments of the present inventive concept, the substrate 100 may have a top surface whose crystal plane is a (100) plane, a (110) plane, or a (111) plane.

The substrate 100 may include a first active region AR1 and a second active region AR2. Each of the first and second active regions AR1 and AR2 may extend in the second direction D2. In some embodiments of the present inventive concept, the first active region AR1 may be a PMOSFET region, and the second active region AR2 may be an NMOSFET region.

The substrate 100 may include a first active pattern AP1 and a second active pattern AP2. The first active pattern AP1 and the second active pattern AP2 may be defined by a trench TR on the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be portions of the substrate 100 that protrude in a third direction D3. The third direction D3 may intersect the first direction D1 and the second direction D2. For example, the third direction D3 may be a vertical direction that is substantially perpendicular to the first direction D1 and the second direction D2.

A device isolation layer ST may be provided on the substrate 100. The device isolation layer ST may fill the trench TR. The device isolation layer ST may include, for example, a dielectric material. For example, the device isolation layer ST may include oxide.

The first active pattern AP1 may be provided with first source/drain patterns SD1 that overlap the first active pattern AP1 in the third direction D3. The first source/drain patterns SD1 may be arranged in the second direction D2 while on the first active pattern AP1. The second active pattern AP2 may be provided with second source/drain patterns SD2 that overlap the second active pattern AP2 in the third direction D3. The second source/drain patterns SD2 may be arranged in the second direction D2 while on the second active pattern AP2.

The first and second source/drain patterns SD1 and SD2 may be epitaxial patterns formed by a selective epitaxial growth (SEG) process. The first and second source/drain patterns SD1 and SD2 may include the same semiconductor material as each other. For example, the first and second source/drain patterns SD1 and SD2 may include at least one of silicon (Si), silicon-germanium (SiGe), and/or germanium (Ge). In some embodiments of the present inventive concept, the first source/drain patterns SD1 may include p-type impurities to have a p-type conductivity, and the second source/drain patterns SD2 may include impurities to have an n-type conductivity.

First, second, third, and fourth channel structures CH1, CH2, CH3, and CH4 may be provided. The first, second, third, and fourth channel structures CH1, CH2, CH3, and CH4 may be provided between the first source/drain patterns SD1 or between the second source/drain patterns SD2. The first, second, third, and fourth channel structures CH1, CH2, CH3, and CH4 may overlap in the third direction D3 with the first active pattern AP1 or the second active pattern AP2. For example, the first, second, third, and fourth channel structures CH1, CH2, CH3, and CH4 may overlap with each other in the third direction D3.

The first, second, third, and fourth channel structures CH1, CH2, CH3, and CH4 that overlap each other in the third direction D3 may be provided either between two first source/drain patterns SD1 that are adjacent to each other in the second direction D2 or between two second source/drain patterns SD2 that are adjacent to each other in the second direction D2.

Gate electrodes GE may be provided and may extend in the first direction D1. The gate electrode GE may intersect one or more of the first and second active patterns AP1 and AP2. The gate electrode GE may intersect the first, second, third, and fourth channel structures CH1, CH2, CH3, and CH4. The gate electrode GE may overlap in the third direction D3 with the first, second, third, and fourth channel structures CH1, CH2, CH3, and CH4.

The gate electrode GE may include a first electrode portion PO1 disposed between the first channel structure CH1 and the active pattern AP1 or AP2, a second electrode portion PO2 disposed between the first and second channel structures CH1 and CH2, a third electrode portion PO3 disposed between the second and third channel structures CH2 and CH3, a fourth electrode portion PO4 disposed between the third and fourth channel structures CH3 and CH4, a fifth electrode portion PO5 disposed on the fourth channel structure CH4, and a sixth electrode portion PO6 connected to the first, second, third, fourth, and fifth electrode portions PO1, PO2, PO3, PO4, and PO5. The gate electrode GE may include a conductive material. The gate electrode GE and the first, second, third, and fourth channel structures CH1, CH2, CH3, and CH4 may constitute a three-dimensional field effect transistor (e.g., MBCFET or GAAFET).

A pair of gate spacers GS may be disposed on opposite sides of each of the gate electrodes GE. The gate spacers GS may extend in the first direction D1 along the gate electrode GE. The gate spacers GS may have their top surfaces higher than that of the gate electrode GE. The top surfaces of the gate spacers GS may be substantially coplanar with that of a first interlayer dielectric layer 110 which will be discussed below.

A gate capping pattern GP may be provided on the gate electrode GE. The gate capping pattern GP may extend in the first direction D1 along the gate electrode GE. The gate capping pattern GP may include a dielectric material having an etch selectivity with respect to first and second interlayer dielectric layers 110 and 120 which will be discussed below. For example, the gate capping pattern GP may include nitride.

A semiconductor layer SL may be provided. The semiconductor layer SL may be in contact with the first, second, third, and fourth channel structures CH1, CH2, CH3, and CH4, the active pattern AP1 or AP2, and the source/drain pattern SD1 or SD2.

A gate dielectric layer GI may be provided. The gate dielectric layer GI may separate the gate electrode GE from the semiconductor layer SL. For example, the gate dielectric layer GI may be disposed between the gate electrode GE and the semiconductor layer SL. For example, the gate dielectric layer GI may be in contact with the gate electrode GE and the semiconductor layer SL. The semiconductor layer SL may separate the gate dielectric layer GI from the first, second, third, and fourth channel structures CH1, CH2, CH3, and CH4 and the source/drain pattern SD1 or SD2. For example, the semiconductor layer SL may be disposed between the gate dielectric layer GI and the first, second, third, and fourth channel structures CH1, CH2, CH3, and CH4, and between the source/drain pattern SD1 or SD2 and the gate dielectric layer GI. The gate dielectric layer GI may include a dielectric material. For example, the gate dielectric layer GI may include oxide.

A first interlayer dielectric layer 110 may be formed to cover the gate spacers GS and the first and second source/drain patterns SD1 and SD2. The first interlayer dielectric layer 110 may have a top surface substantially coplanar with that of the gate capping pattern GP and that of the gate spacer GS. A second interlayer dielectric layer 120 may be disposed to cover the gate capping pattern GP. A third interlayer dielectric layer 130 may be provided on the second interlayer dielectric layer 120. A fourth interlayer dielectric layer 140 may be provided on the third interlayer dielectric layer 130. The first, second, third, and fourth interlayer dielectric layers 110, 120, 130, and 140 may each include a dielectric material. For example, the first, second, third, and fourth interlayer dielectric layers 110, 120, 130, and 140 may each include oxide.

The single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The single height cell SHC may be provided on its opposite sides with a pair of separation structures DB that are opposite to each other in the second direction D2. For example, the pair of separation structures DB may be correspondingly provided on the first and second boundaries BD1 and BD2 of the single height cell SHC. The separation structures DB may extend in the first direction D1. A pitch between the separation structure DB and the gate electrode GE may be the same as that between the gate electrodes GE.

The separation structure DB may penetrate the first and second interlayer dielectric layers 110 and 120. A lower portion of the separation structure DB may penetrate in the third direction D3 through an upper portion of each of the first and second active patterns AP1 and AP2. The separation structure DB may have a bottom surface at a level higher than that of a bottom surface of the device isolation layer ST. The separation structure DB may include a dielectric material.

Active contacts AC may be provided to penetrate the first and second interlayer dielectric layers 110 and 120. The active contact AC may be electrically connected to the first source/drain pattern SD1 or the second source/drain pattern SD2. The gate electrode GE may be provided between the active contacts AC that are adjacent to each other in the second direction D2. The active contact AC may have a linear or rectangular shape that extends in the first direction D1.

In some embodiments of the present inventive concept, a metal-semiconductor compound layer may be interposed between the active contact AC and the source/drain pattern SD1 or SD2. In this case, the active contact AC may be electrically connected through the metal-semiconductor compound layer to the source/drain pattern SD1 or SD2. For example, the metal-semiconductor compound layer may include at least one of titanium-silicide, tantalum-silicide, tungsten-silicide, nickel-silicide, and/or cobalt-silicide.

In some embodiments of the present inventive concept, the active contact AC may include a conductive pattern and a barrier pattern. The barrier pattern may cover sidewalls and a bottom surface of the conductive pattern. For example, the conductive pattern may include at least one of aluminum, copper, tungsten, molybdenum, and/or cobalt, and the barrier pattern may include at least one of titanium, tantalum, tungsten, nickel, cobalt, titanium nitride (TiN), tantalum nitride (TaN), tungsten nitride (WN), nickel nitride (NiN), cobalt nitride (CON), and/or platinum nitride (PtN).

A gate contact GC may be provided. The gate contact GC may penetrate the second interlayer dielectric layer 120 and the gate capping pattern GP. The gate contact GC may be connected to the gate electrode GE. The gate contact GC may include a conductive material.

An upper dielectric pattern UIP may be provided on the active contact AC that is adjacent to the gate contact GC. The upper dielectric pattern UIP may have a bottom surface lower than that of the gate contact GC. The upper dielectric pattern UIP may cause the active contact AC that is adjacent the gate contact GC to have a top surface at a level lower than that of the bottom surface of the gate contact GC. The upper dielectric pattern UIP may prevent a short-circuit caused by contact between the gate contact GC and the active contact AC.

A first metal layer M1 may be provided in the third interlayer dielectric layer 130. In some embodiments of the present inventive concept, the first metal layer M1 may include a first power line M1_R1, a second power line M1_R2, and first wiring lines M1_I. The lines M1_R1, M1_R2, and M1_I of the first metal layer M1 may extend in the second direction D2 and parallel to each other.

The first and second power lines M1_R1 and M1_R2 may be respectively provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I of the first metal layer M1 may be disposed between the first and second power lines M1_R1 and M1_R2. Each of the first wiring lines M1_I may have a line-width less than that of each of the first and second power lines M1_R1 and M1_R2.

The first metal layer M1 may further include first vias VI1. The first vias VI1 may be correspondingly provided below the lines M1_R1, M1_R2, and M1_I of the first metal layer M1. The active contact AC may be electrically connected through the first via VI1 to a wiring line M1_R1, M1_R2, or M1_I of the first metal layer M1. The gate contact GC may be electrically connected through the first via VI1 to a wiring line M1_R1, M1_R2, or M1_I of the first metal layer M1.

A second metal layer M2 may be provided on the fourth interlayer dielectric layer 140. The second metal layer M2 may include a plurality of second wiring lines M2_I. Each of the second wiring lines M2_I of the second metal layer M2 may have a linear or rectangular shape that extends in the first direction D1. For example, the second wiring lines M2_I may extend in the first direction D1 and may extend parallel to each other.

The second metal layer M2 may further include second vias VI2 that are correspondingly provided below the second wiring lines M2_I. A wiring line of the first metal layer M1 may be electrically connected to a wiring line of the second metal layer M2 through the second via VI2.

The first metal layer M1 and the second metal layer M2 may include materials that are the same as or different from each other. For example, the first metal layer M1 and the second metal layer M2 may include may each include at least one of aluminum, copper, tungsten, molybdenum, ruthenium, or cobalt.

Referring to FIGS. 4F and 4G, the first channel structure CH1 may include a first lower channel layer 11, a first upper channel layer 13, and a first intervening channel layer 12 disposed between the first lower channel layer 11 and the first upper channel layer 13. For example, the first intervening channel layer 12 may separate the first lower channel layer 11 and the first upper channel layer 13 from each other.

Each of the first lower and upper channel layers 11 and 13 may have a thickness in the third direction D3 that is less than a thickness in the third direction D3 of the first intervening channel layer 12. The thickness in the third direction D3 of the first intervening channel layer 12 may be greater than a thickness of the semiconductor layer SL. The thickness in the third direction D3 of the first intervening channel layer 12 may be greater than a thickness of the gate dielectric layer GI. The thickness of the first intervening channel layer 12 may range, for example, from about 4 nm to about 5 nm. The thickness of the semiconductor layer SL may be, for example, about 5 Å.

The second channel structure CH2 may include a second lower channel layer 21, a second upper channel layer 23, and a second intervening channel layer 22 disposed between the second lower channel layer 21 and the second upper channel layer 23.

The third channel structure CH3 may include a third lower channel layer 31, a third upper channel layer 33, and a third intervening channel layer 32 disposed between the third lower channel layer 31 and the third upper channel layer 33.

The fourth channel structure CH4 may include a fourth lower channel layer 41, a fourth upper channel layer 43, and a fourth intervening channel layer 42 disposed between the fourth lower channel layer 41 and the fourth upper channel layer 43.

The first intervening channel layer 12 and the semiconductor layer SL may include a semiconductor material different from that of the first lower channel layer 11 and the first upper channel layer 13. For example, the semiconductor layer SL and the first intervening channel layer 12 may include silicon oxide, and the first lower channel layer 11 and the first upper channel layer 13 may include silicon-germanium. The first lower channel layer 11 and the first upper channel layer 13 may have a germanium concentration of, for example, equal to or greater than about 5 wt % and less than about 40 wt %.

In some embodiments of the present inventive concept, the first lower channel layer 11 and the first upper channel layer 13 may include at least one of boron (B), phosphorus (P), carbon (C), and/or arsenic (As). In some embodiments of the present inventive concept, the first intervening channel layer 12 and the semiconductor layer SL may include monocrystalline silicon.

The second, third, and fourth lower channel layers 21, 31, and 41 and the second, third, and fourth upper channel layers 23, 33, and 43 may include the same material as that of the first lower channel layer 11 and the first upper channel layer 13. The second, third, and fourth intervening channel layers 22, 32, and 42 may include the same material as that of the first intervening channel layer 12.

The first lower channel layer 11 may have a first lower sidewall 11_S1 that is in contact with the source/drain pattern SD1 or SD2. The first intervening channel layer 12 may have a first intervening sidewall 12_S1 that is in contact with the source/drain pattern SD1 or SD2. The first upper channel layer 13 may have a first upper sidewall 13_S1 that is in contact with the source/drain pattern SD1 or SD2. The first lower sidewall 11_S1 may be curved, and this may hold true for the first intervening sidewall 12_S1 and the first upper sidewall 13_S1. The first intervening sidewall 12_S1 may be spaced apart from the semiconductor layer SL. The first lower sidewall 11_S, the first intervening sidewall 12_S1, and the first upper sidewall 13_S1 may extend in the first direction D1.

The first lower channel layer 11 may have a top surface 11_T that is in contact with a bottom surface 12_B of the first intervening channel layer 12. The first intervening channel layer 12 may have a top surface 12_T that is in contact with a bottom surface 13_B of the first upper channel layer 13. The top surface 12_T of the first intervening channel layer 12 may be in contact with the source/drain pattern SD1 or SD2. The bottom surface 12_B of the first intervening channel layer 12 may be in contact with the source/drain pattern SD1 or SD2.

The semiconductor layer SL may include a first semiconductor portion 51, a second semiconductor portion 54, and a third semiconductor portion 52. The first semiconductor 51 portion may be in contact with a top surface of the active pattern AP1 or AP2, and the second semiconductor portion 54 may be in contact with a bottom surface 11_B of the first lower channel layer 11. A third semiconductor portion 52 may connect the first semiconductor portion 51 to the second semiconductor portion 54. The first, second, and third semiconductor portions 51, 54, and 52 may be disposed between the first channel structure CH1 and the active pattern AP1 or AP2. The third semiconductor portion 52 may be in contact with the source/drain pattern SD1 or SD2.

The semiconductor layer SL may further include a fourth semiconductor portion 55 and a fifth semiconductor portion 57. The fourth semiconductor portion 55 may be in contact with a top surface 13_T of the first upper channel layer 13, and the fifth semiconductor portion 57 may connect the second semiconductor portion 54 to the fourth semiconductor portion 55.

The first lower channel layer 11 may have a second lower sidewall 11_S2 that is in contact with the fifth semiconductor portion 57. The first intervening channel layer 12 may have a second intervening sidewall 12_S2 that is in contact with the fifth semiconductor portion 57. The first upper channel layer 13 may have a second upper sidewall 13_S2 that is in contact with the fifth semiconductor portion 57. The second lower sidewall 11_S2, the second intervening sidewall 12_S2, and the second upper sidewall 13_S2 may be coplanar or substantially coplanar with each other. The second lower sidewall 11_S2, the second intervening sidewall 12_S2, and the second upper sidewall 13_S2 may extend in the second direction D2.

The semiconductor layer SL may further include a sixth semiconductor portion 58 and a seventh semiconductor portion 56. The sixth semiconductor portion 58 may be in contact with a bottom surface of the second lower channel layer 21, and the seventh semiconductor portion 56 may connect the fourth semiconductor portion 55 to the sixth semiconductor portion 58. The seventh semiconductor portion 56 may be in contact with the source/drain pattern SD1 or SD2. The fourth, sixth, and seventh semiconductor portions 55, 58, and 56 may be disposed between the first channel structure CH1 and the second channel structure CH2.

The semiconductor layer SL may further include an eighth semiconductor portion 59 in contact with a top surface of the fourth upper channel layer 43. The eighth semiconductor portion 59 may be disposed on sidewalls of the gate spacers GS. For example, the eighth semiconductor portion 59 may be in contact with sidewalls of the gate spacers GS.

The gate dielectric layer GI may include a first dielectric portion 61, a second dielectric portion 64, and a third dielectric portion 62. The first dielectric portion 61 may be in contact with a top surface of the first semiconductor portion 51, and a second dielectric portion 64 may be in contact with a bottom surface of the second semiconductor portion 54. The third dielectric portion 62 may connect the first dielectric portion 61 to the second dielectric portion 64.

The first, second, and third dielectric portions 61, 64, and 62 may be disposed between the first channel structure CH1 and the active pattern AP1 or AP2. The first dielectric portion 61 may be disposed between the first electrode portion PO1 and the first semiconductor portion 51. The second dielectric portion 64 may be disposed between the second semiconductor portion 54 and the first electrode portion PO1. The third dielectric portion 62 may be disposed between the third semiconductor portion 52 and the first electrode portion PO1.

The gate dielectric layer GI may further include a fourth dielectric portion 65 and a fifth dielectric portion 67. The fourth dielectric portion 65 may be in contact with a top surface of the fourth semiconductor portion 55, and the fifth dielectric portion 67 may connect the second dielectric portion 64 to the fourth dielectric portion 65.

The gate dielectric layer GI may further include a sixth dielectric portion 68 and a seventh dielectric portion 66. The sixth dielectric portion 68 may be in contact with a bottom surface of the sixth semiconductor portion 58, and the seventh dielectric portion 66 may connect the fourth dielectric portion 65 to the sixth dielectric portion 68 to each other.

The fourth, sixth, and seventh dielectric portions 65, 68, and 66 may be disposed between the first channel structure CH1 and the second channel structure CH2. The fourth dielectric portion 65 may be disposed between the second electrode portion PO2 and the fourth semiconductor portion 55. The sixth dielectric portion 68 may be disposed between the second electrode portion PO2 and the sixth semiconductor portion 58. The seventh dielectric portion 66 may be disposed between the seventh semiconductor portion 56 and the second electrode portion PO2.

The gate dielectric layer GI may further include an eighth dielectric portion 69 in contact with a top surface of the eighth semiconductor portion 59. The eighth dielectric portion 69 may be disposed between the fifth electrode portion PO5 and the eighth semiconductor portion 59.

Each of the first lower and upper channel layers 11 and 13 may have a width in the second direction D2 less than a width in the second direction D2 of the first intervening channel layer 12.

A width in the second direction D2 of the fourth upper channel layer 43 may be greater than a width in the second direction D2 of the fourth lower channel layer 41.

In the semiconductor device according to some embodiments of the present inventive concept, as the lower channel layers 11, 21, 31, and 41 and the upper channel layers 13, 23, 33, and 43 include silicon-germanium, and as the semiconductor layer SL and the intervening channel layers 12, 22, 32, and 42 include silicon, a compressive stress may be provided to the lower channel layers 11, 21, 31, and 41 and the upper channel layers 13, 23, 33, and 43, and a tensile stress may be provided to the semiconductor layer SL and the intervening channel layers 12, 22, 32, and 42. Therefore, the channel structures CH1, CH2, CH3, and CH4 may all have relatively large mobility of electrons, and may serve as a channel of NMOSFET or a channel of PMOSFET.

The semiconductor device according to some embodiments of the present inventive concept may have a relatively small surface roughness between the semiconductor layer SL and the lower channel layers 11, 21, 31, and 41 or between the semiconductor layer SL and the upper channel layers 13, 23, 33, and 43. Therefore, the channel structures CH1, CH2, CH3, and CH4 may have relatively large carrier mobility.

Figure 4H:
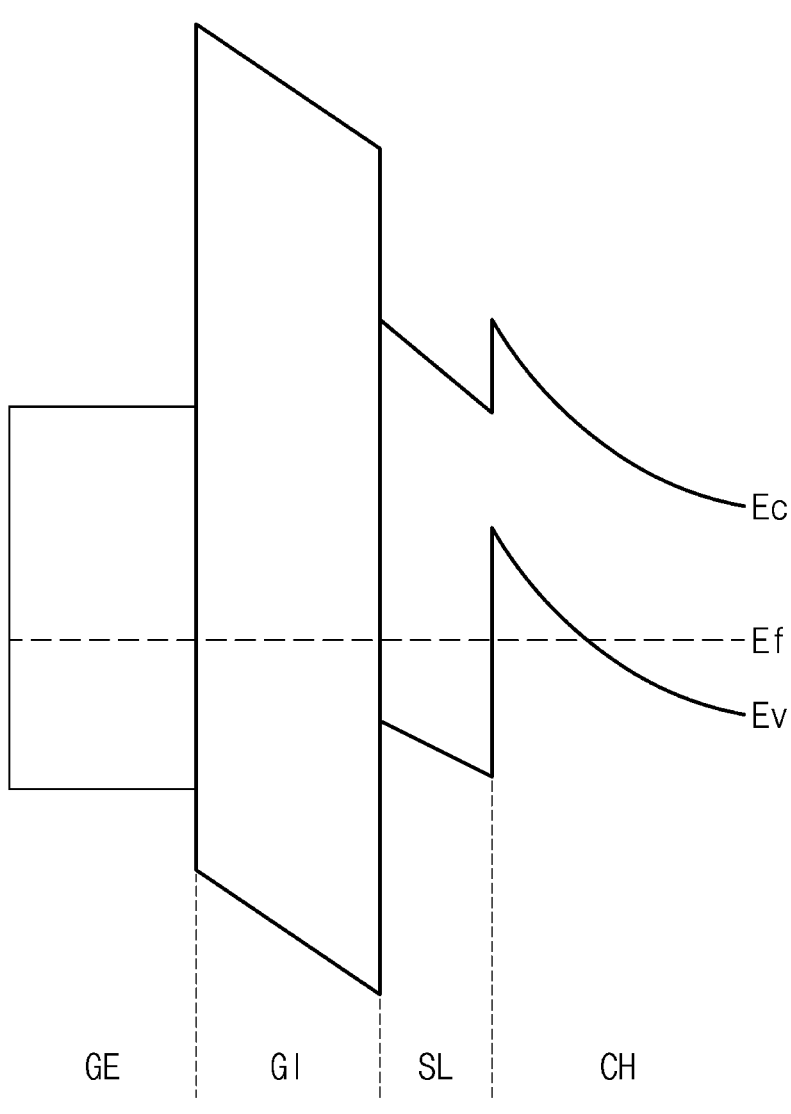
FIGS. 4H and 4I illustrate energy band diagrams of a semiconductor device according to some embodiments of the present inventive concept.
Figure 4I:
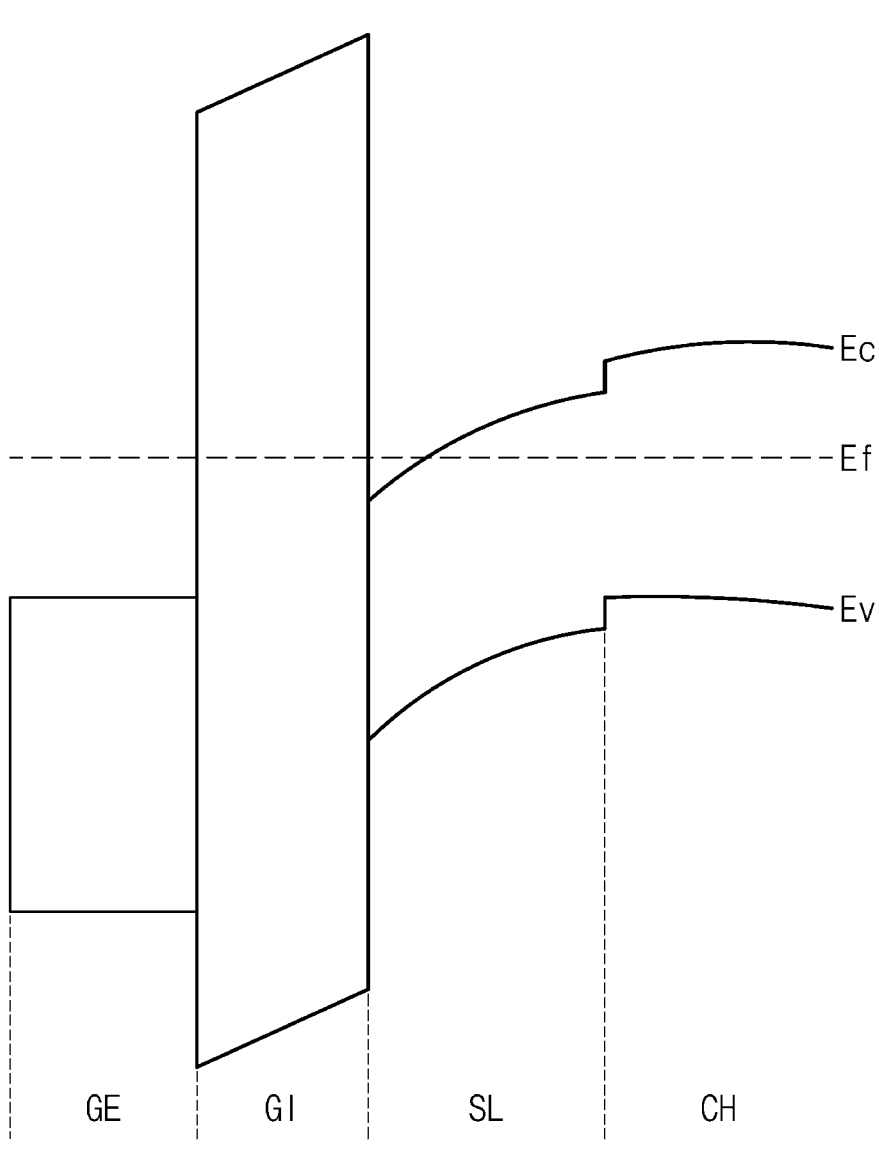

FIGS. 4H and 4I illustrate energy band diagrams of a semiconductor device according to some embodiments of the present inventive concept.

Referring to FIG. 4H, when a negative voltage is applied to a gate electrode GE, a two-dimensional hole gas may be formed at an interface between a semiconductor layer SL and a lower channel layer (or an upper channel layer) of a channel structure CH.

Referring to FIG. 4I, when a positive voltage is applied to a gate electrode GE, a surface electron may be formed at an interface between a semiconductor layer SL and a gate dielectric layer GI, and the surface electron may cause a flow of current.

As such, in accordance with a gate voltage, the channel structure of a semiconductor device may serve as a channel of NMOSFET or a channel of PMOSFET.

FIGS. 5A, 5B, 5C, 6A, 6B, 7A, 7B, 7C, 8, 9A, 9B, 10A, 10B, 11A, and 11B illustrate diagrams showing a method of fabricating a semiconductor device according to some embodiments of the present inventive concept.

Figure 5A:
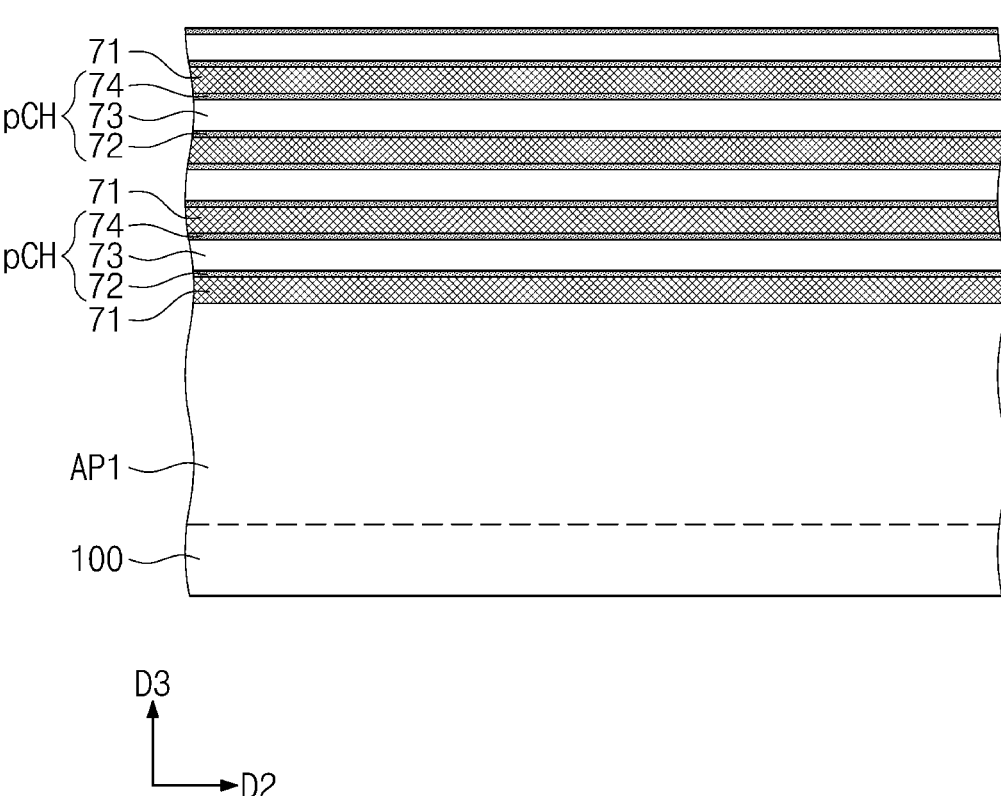
FIGS. 5A, 5B, 5C, 6A, 6B, 7A, 7B, 7C, 8, 9A, 9B, 10A, 10B, 11A, and 11B illustrate diagrams showing a method of fabricating a semiconductor device according to some embodiments of the present inventive concept.
Figure 5B:
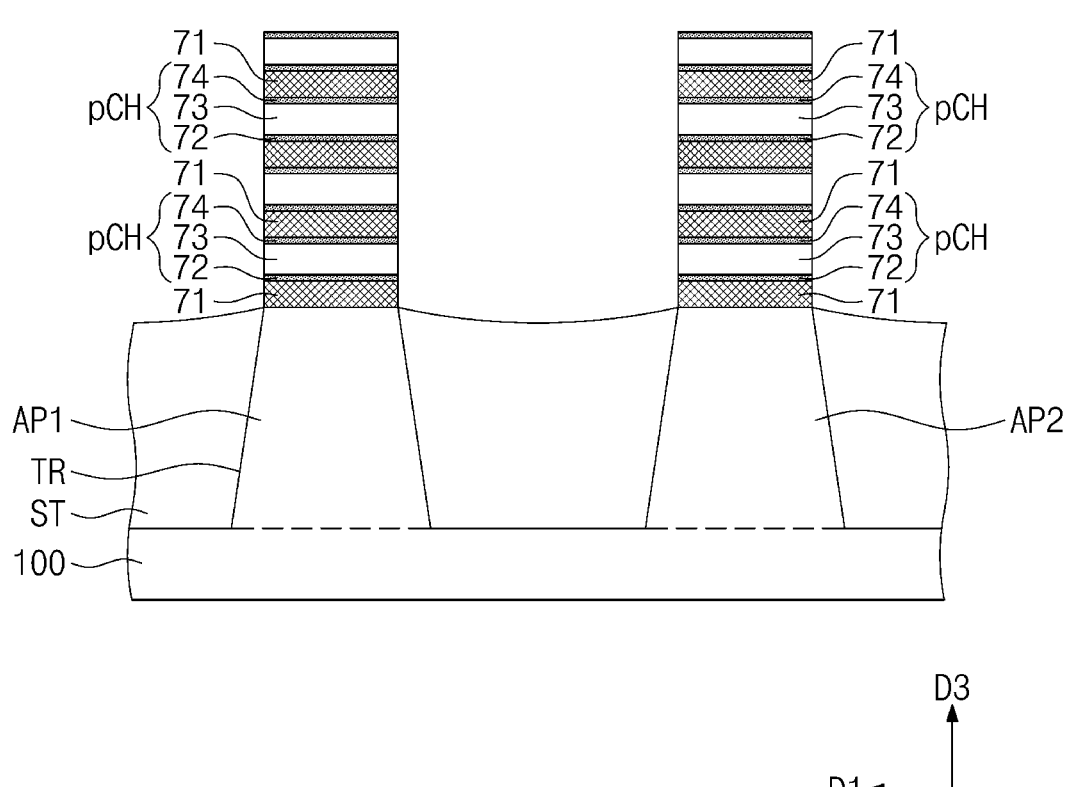
Figure 5C:
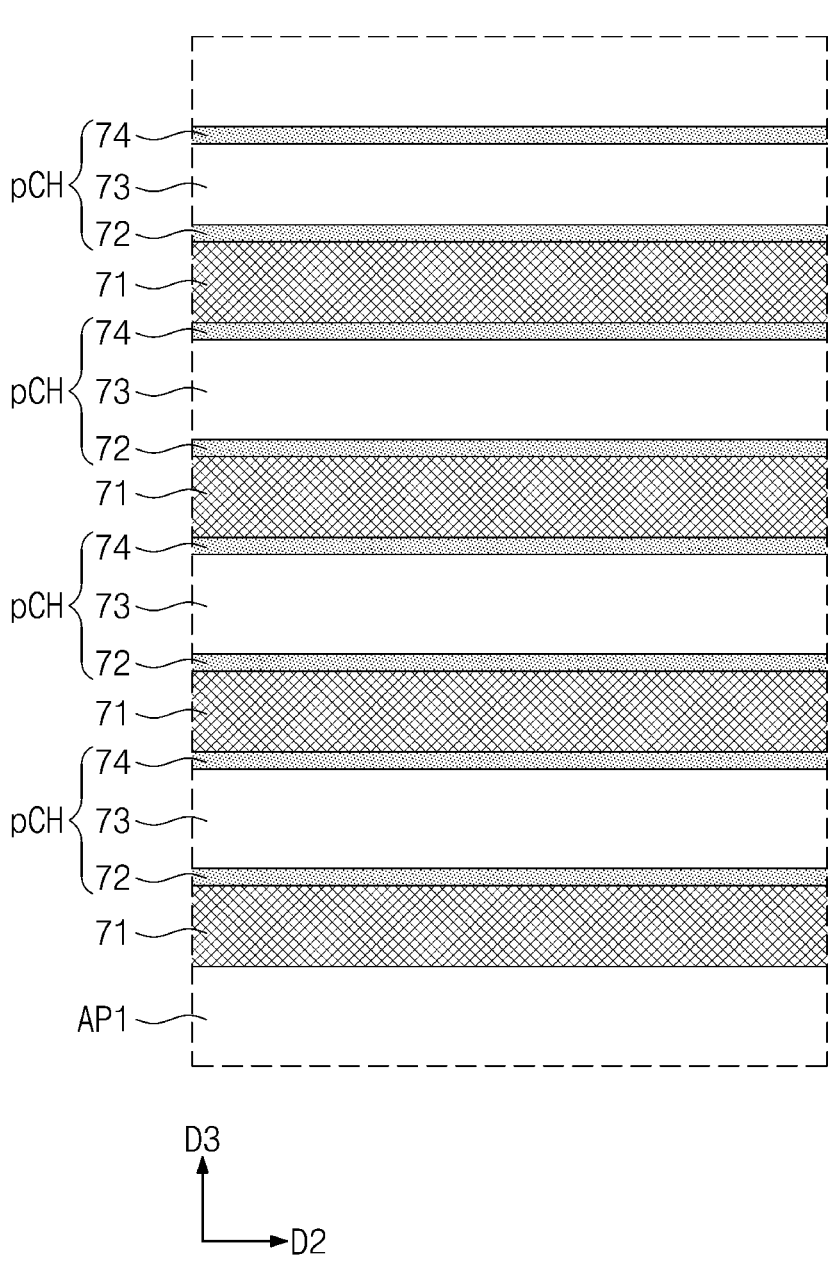

Referring to FIGS. 5A, 5B, and 5C, there may be formed active patterns AP1 and AP2, preliminary channel structures pCH, and material layers 71. A trench TR and a device isolation layer ST may be formed in a process for forming the active patterns AP1 and AP2, the preliminary channel structures pCH, and the material layers 71.

The material layers 71 and the preliminary channel structures pCH may be alternately stacked along a third direction D3 on each of the active patterns AP1 and AP2. The preliminary channel structure pCH may include a preliminary lower channel layer 72, a preliminary upper channel layer 74, and a preliminary intervening channel layer 73 disposed between the preliminary lower channel layer 72 and the preliminary upper channel layer 74. The preliminary lower channel layer 72 and the preliminary upper channel layer 74 may include a semiconductor material that is different from that of the preliminary intervening channel layer 73.

The material layer 71 may include a material having an etch selectivity with respect to the preliminary lower channel layer 72, the preliminary upper channel layer 74, and the preliminary intervening channel layer 73. In some embodiments of the present inventive concept, each of the material layer 71, the preliminary lower channel layer 72, and the preliminary upper channel layer 74 may include silicon-germanium, and the preliminary intervening channel layer 73 may include silicon. The material layer 71 may have a germanium concentration greater than that of the preliminary lower channel layer 72 and that of the preliminary upper channel layer 74. For example, the material layer 71 may have a germanium concentration of about 40 wt % to about 50 wt %, and the preliminary lower channel layer 72 and the preliminary upper channel layer 74 may have a germanium concentration of equal to or greater than about 5 wt % and less than about 40 wt %.

Figure 6A:
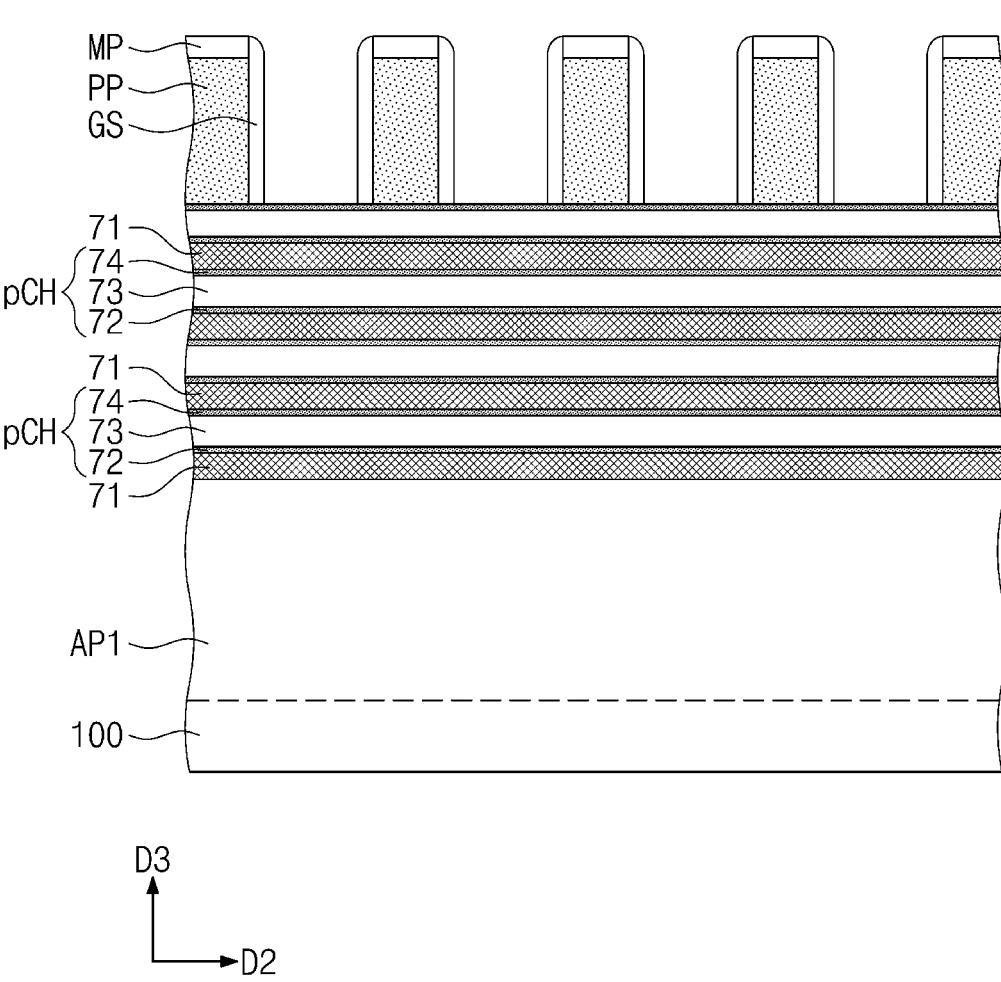
Figure 6B:
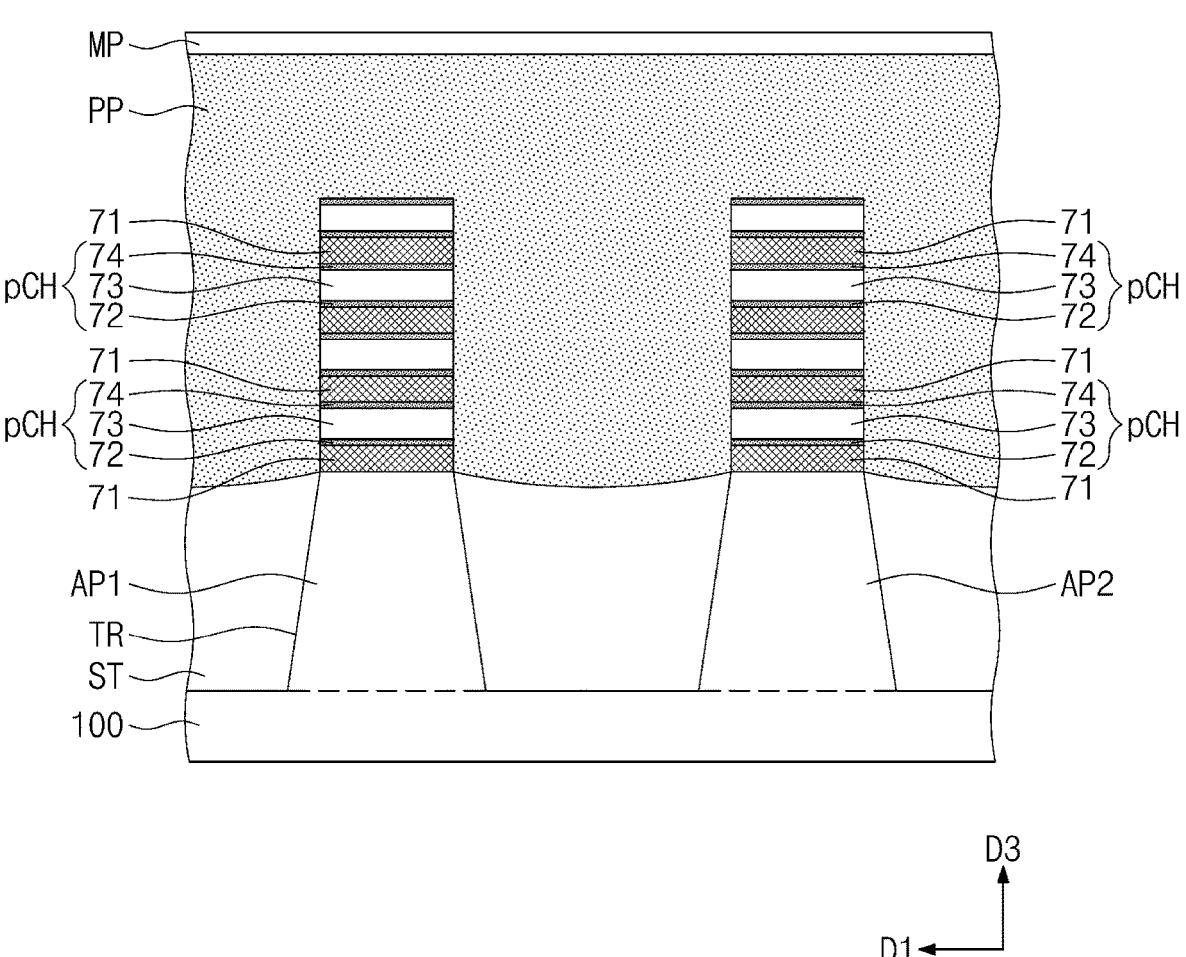

Referring to FIGS. 6A and 6B, sacrificial patterns PP may be formed, and mask patterns MP may be formed on the sacrificial patterns PP. The sacrificial pattern PP and the mask pattern MP may extend in a first direction D1. The sacrificial patterns PP may be arranged in a second direction D2. The mask patterns MP may be arranged in the second direction D2. The sacrificial patterns PP may be formed by an etching process in which the mask patterns MP are used as an etching mask. The sacrificial pattern PP may include, for example, polysilicon. The mask pattern MP may include a dielectric material. A gate spacer GS may be formed on a sidewall of the sacrificial pattern PP and a sidewall of the mask pattern MP.

Figure 7A:
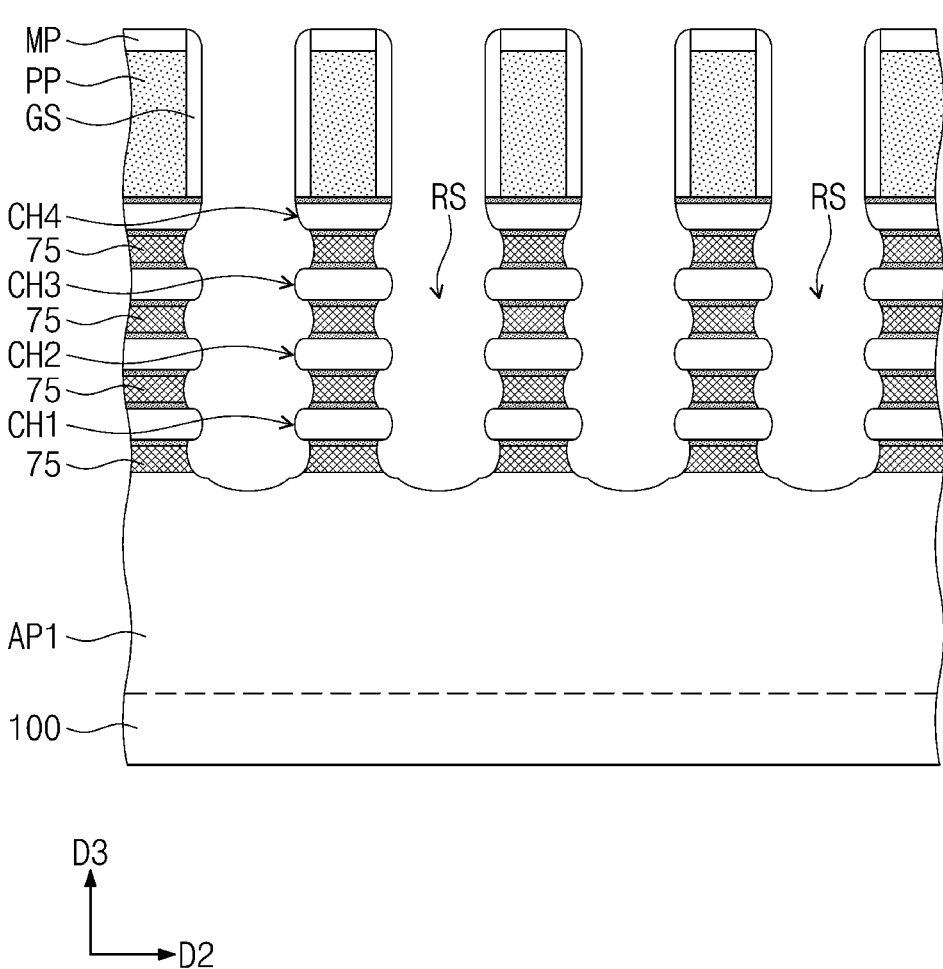
Figure 7B:
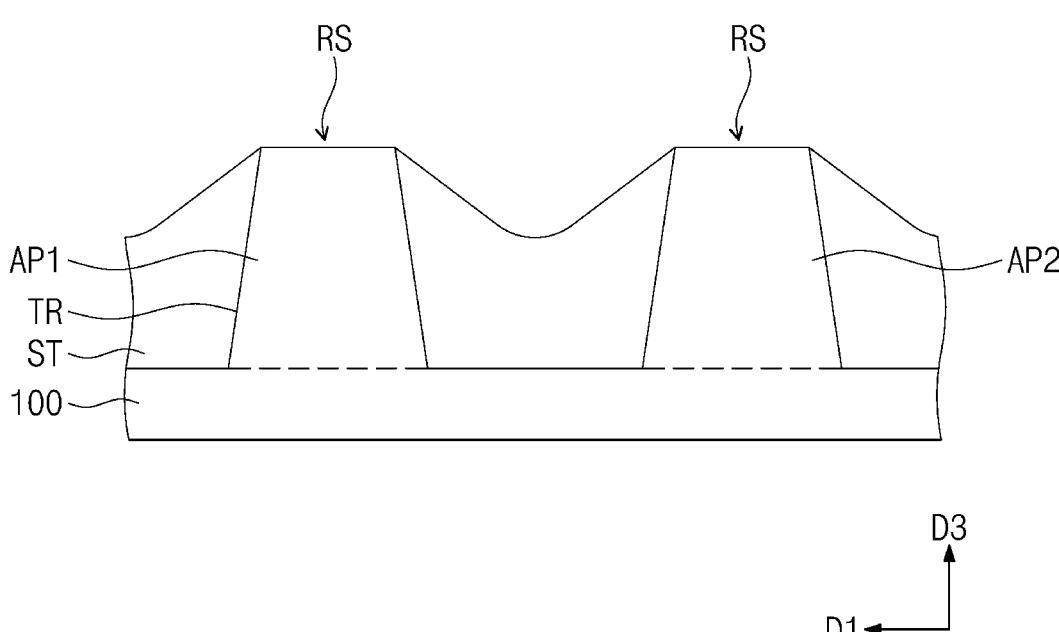
Figure 7C:
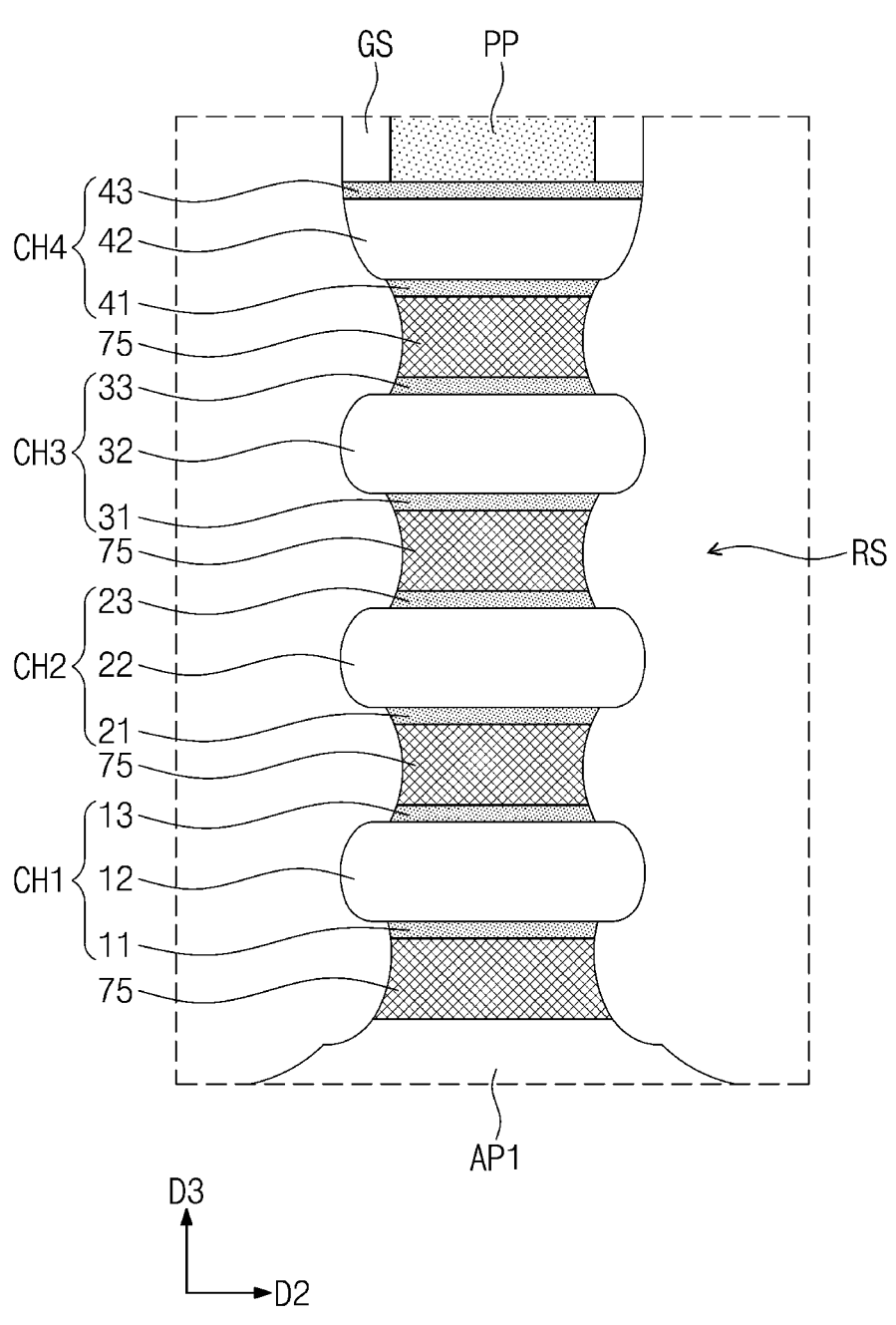

Referring to FIGS. 7A, 7B, and 7C, the mask patterns MP and the gate spacers GS may be used as an etching mask to etch the material layers 71 and the preliminary channel structures pCH. The preliminary channel structures pCH may be etched to form first channel structures CH1, second channel structures CH2, third channel structures CH3, and fourth channel structures CH4. The material layers 71 may be etched to form material patterns 75. The preliminary channel structures pCH and the material layers 71 may be etched to form recesses RS. The recess RS may expose the active pattern AP1 or AP2.

Figure 8:
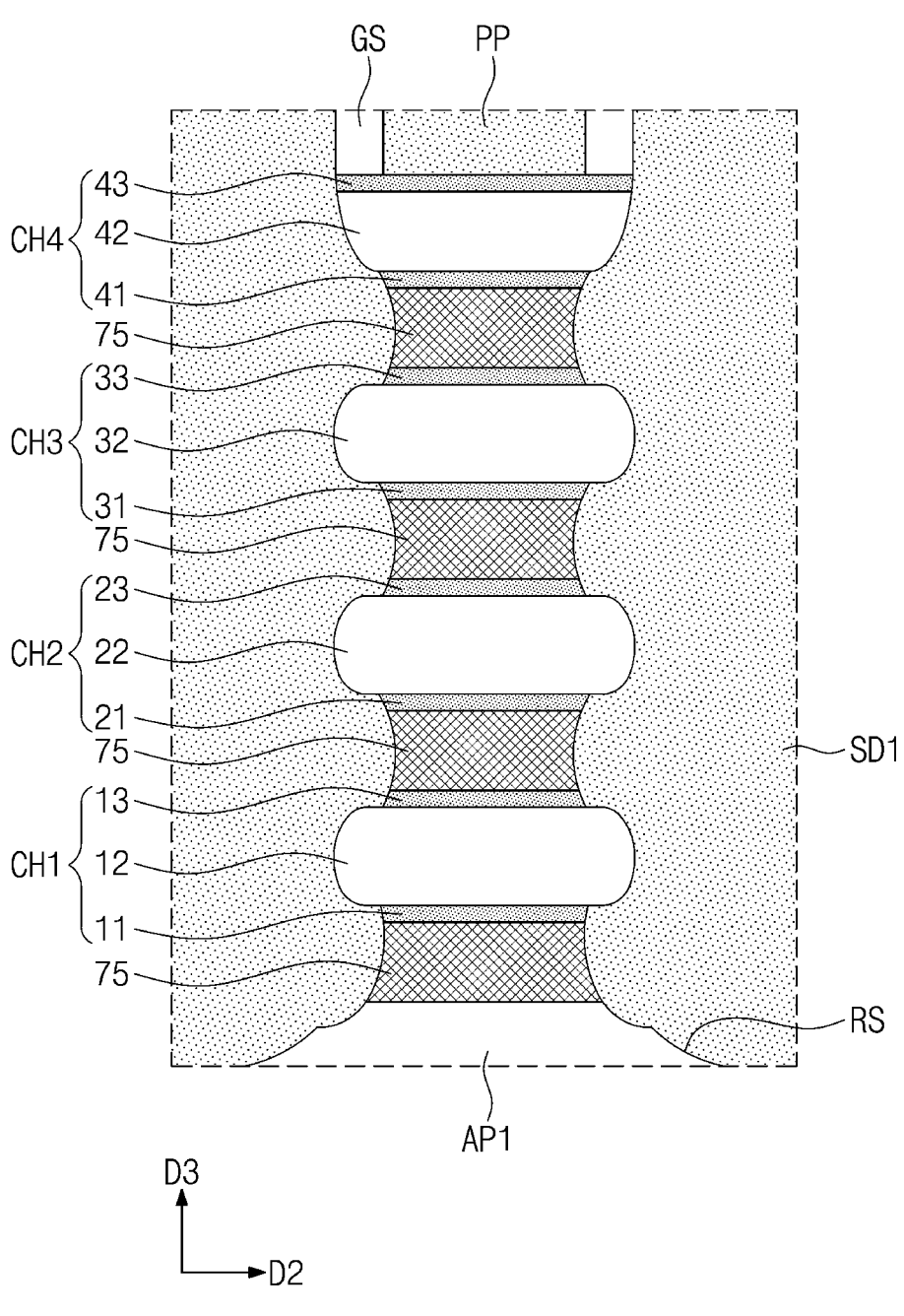

Referring to FIG. 8, there may be formed first source/drain patterns SD1 and second source/drain patterns (see SD2 of FIGS. 4C and 4D). Each of the first and second source/drain patterns SD1 and SD2 may be formed in the recess RS. The first source/drain patterns SD1 and the second source/drain patterns SD2 may be formed by a selective epitaxial growth process. The first source/drain patterns SD1 and the second source/drain patterns SD2 may be simultaneously formed with the same semiconductor material. For example, the first source/drain patterns SD1 and the second source/drain patterns SD2 may be formed in a single process. The first source/drain patterns SD1 and the second source/drain patterns SD2 may be formed to include at least one of, for example, silicon (Si), silicon-germanium (SiGe), and/or germanium (Ge).

After the formation of the first and second source/drain patterns SD1 and SD2, different impurities may be doped into the first and second source/drain patterns SD1 and SD2.

Figure 9A:
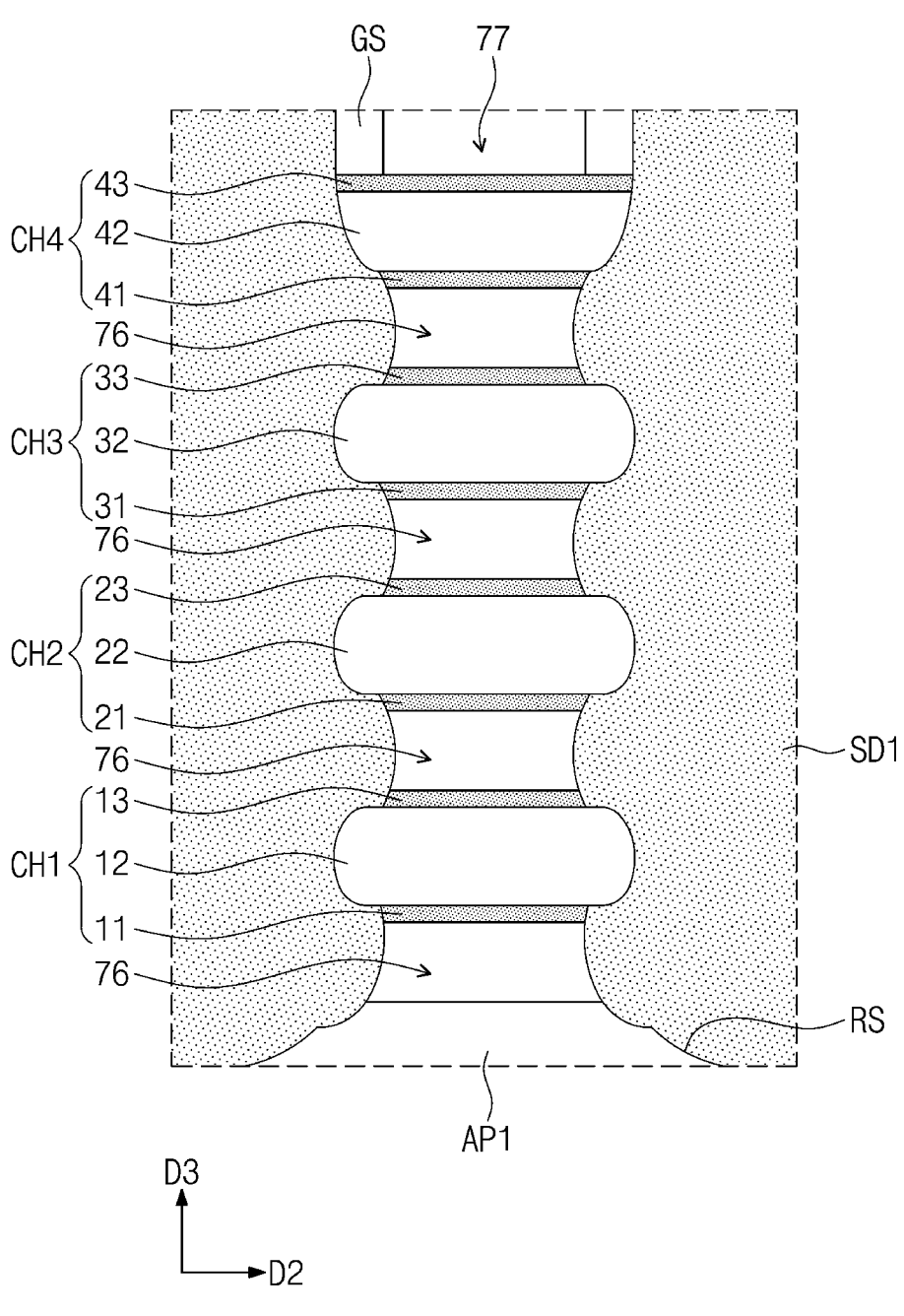
Figure 9B:
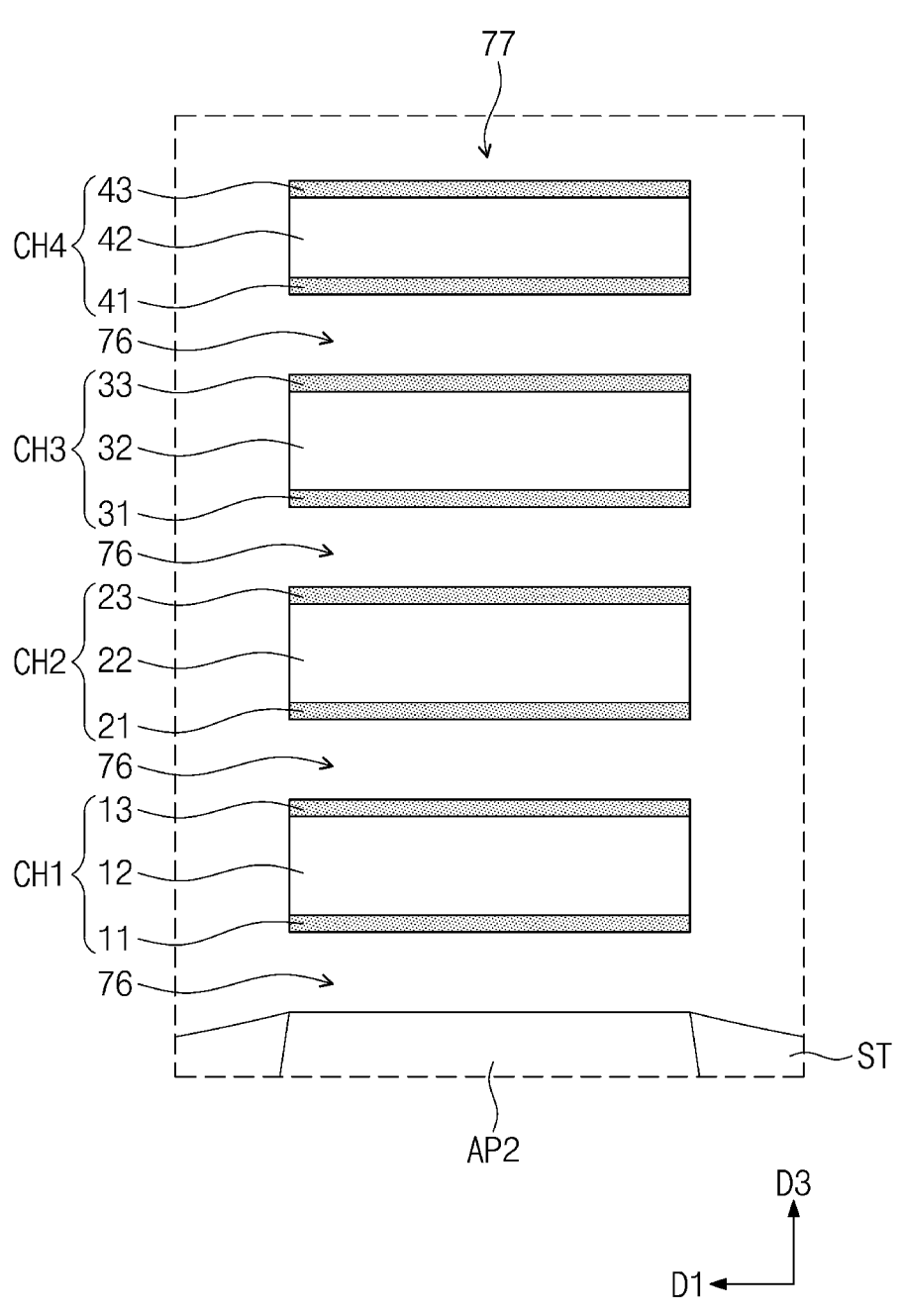

Referring to FIGS. 9A and 9B, a first interlayer dielectric layer (see 110 of FIGS. 4B to 4D) may be formed. The mask patterns MP may be removed, and the sacrificial patterns PP may be exposed. The exposed sacrificial patterns PP may be removed. The removal of the sacrificial patterns PP may form a first space 77 on the fourth channel structure CH4. The removal of the sacrificial patterns PP may expose the material patterns 75 and the first, second, third, and fourth channel structures CH1, CH2, CH3, and CH4.

The exposed material patterns 75 may be removed. The removal of the exposed material patterns 75 may form second spaces 76 between the first, second, third, and fourth channel structures CH1, CH2, CH3, and CH4 and between the first channel structure CH1 and the active patterns AP1 and AP2.

In some embodiments of the present inventive concept, each of the material pattern 75, the first, second, third, and fourth lower channel layers 11, 21, 31, and 41, and the first, second, third, and fourth upper channel layers 13, 23, 33, and 43 may include silicon-germanium, and the material pattern 75 may have a germanium concentration greater than that of each of the first, second, third, and fourth lower channel layers 11, 21, 31, and 41, and that of the first, second, third, and fourth upper channel layers 13, 23, 33, and 43. An etch selectivity caused by a difference in germanium concentration may be used to selectively remove the material pattern 75.

In some embodiments of the present inventive concept, each of the material pattern 75, the first, second, third, and fourth lower channel layers 11, 21, 31, and 41, and the first, second, third, and fourth upper channel layers 13, 23, 33, and 43 may include silicon-germanium, and each of the first, second, third, and fourth lower channel layers 11, 21, 31, and 41 and the first, second, third, and fourth upper channel layers 13, 23, 33, and 43 may further include at least one of boron (B), phosphorus (P), carbon (C), and/or arsenic (As). An etch selectivity caused by B, P, C, or As may be used to selectively remove the material pattern 75.

Figure 10A:
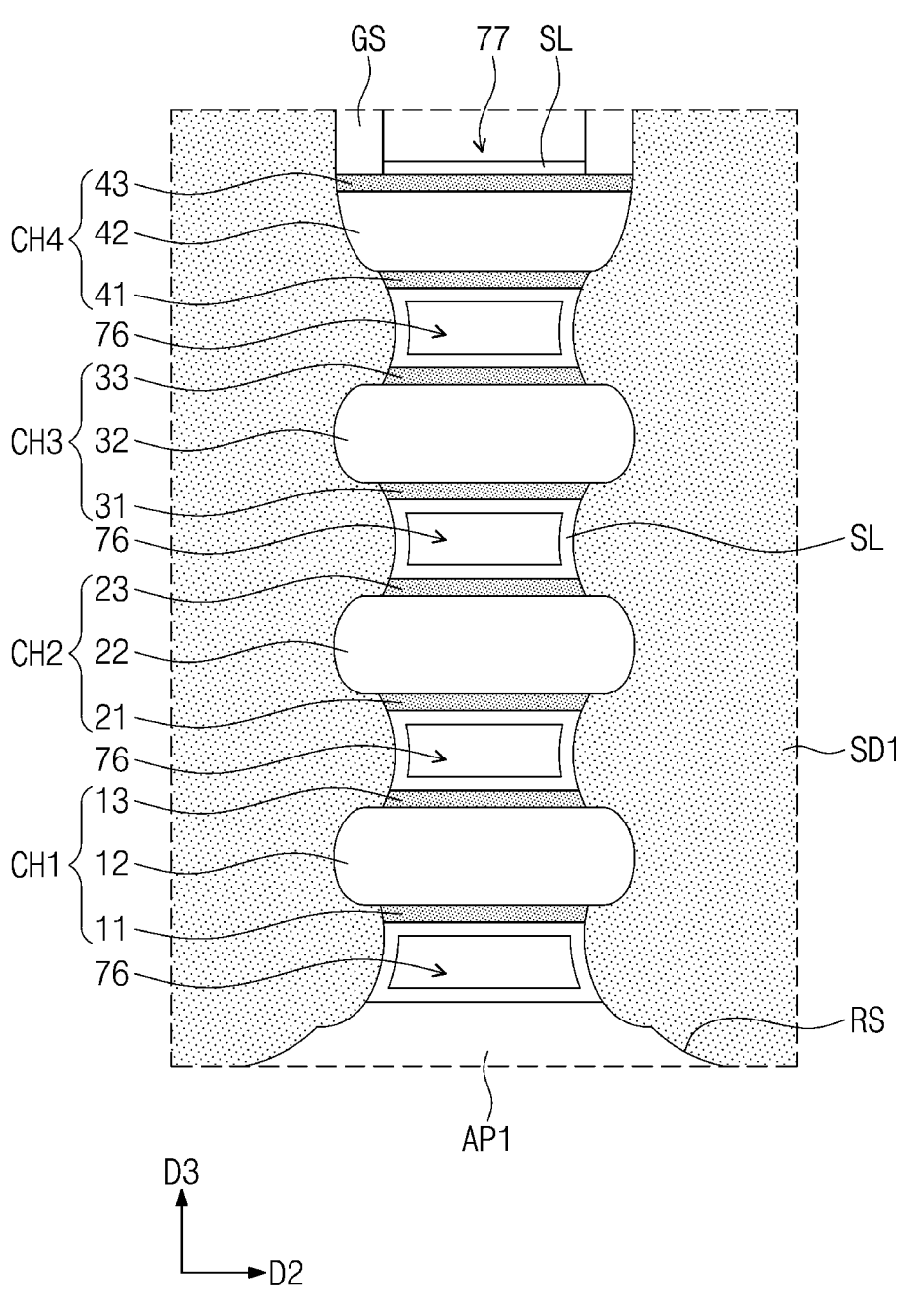
Figure 10B:
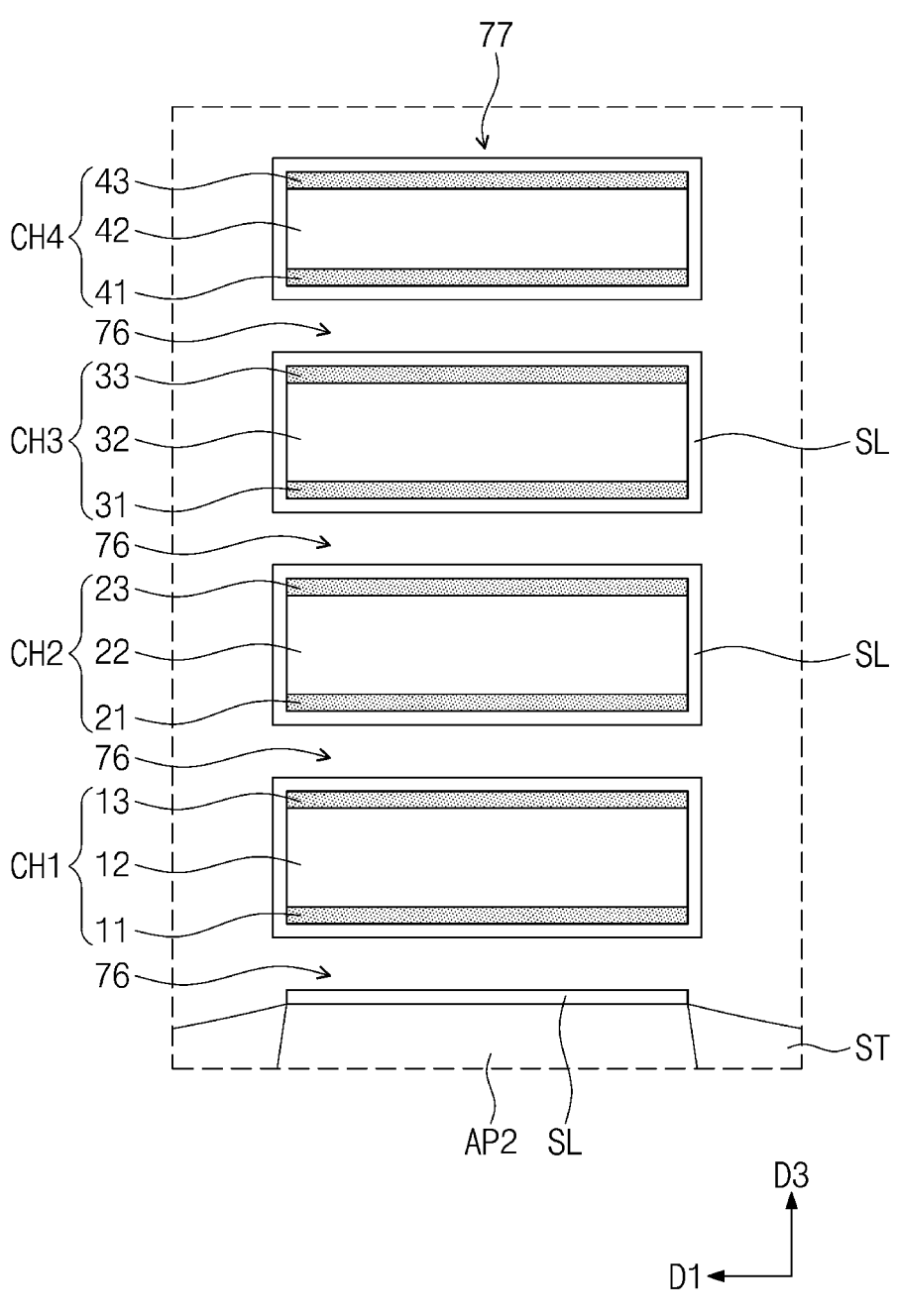

Referring to FIGS. 10A and 10B, a semiconductor layer SL may be formed. The semiconductor layer SL may be formed by a selective epitaxial growth process. The semiconductor layer SL may partially fill the first space 77 and the second space 76. The semiconductor layer SL may be selectively formed on the active patterns AP1 and AP2, the channel structures CH1, CH2, CH3, and CH4, and the source/drain patterns SD1 and SD2.

Figure 11A:
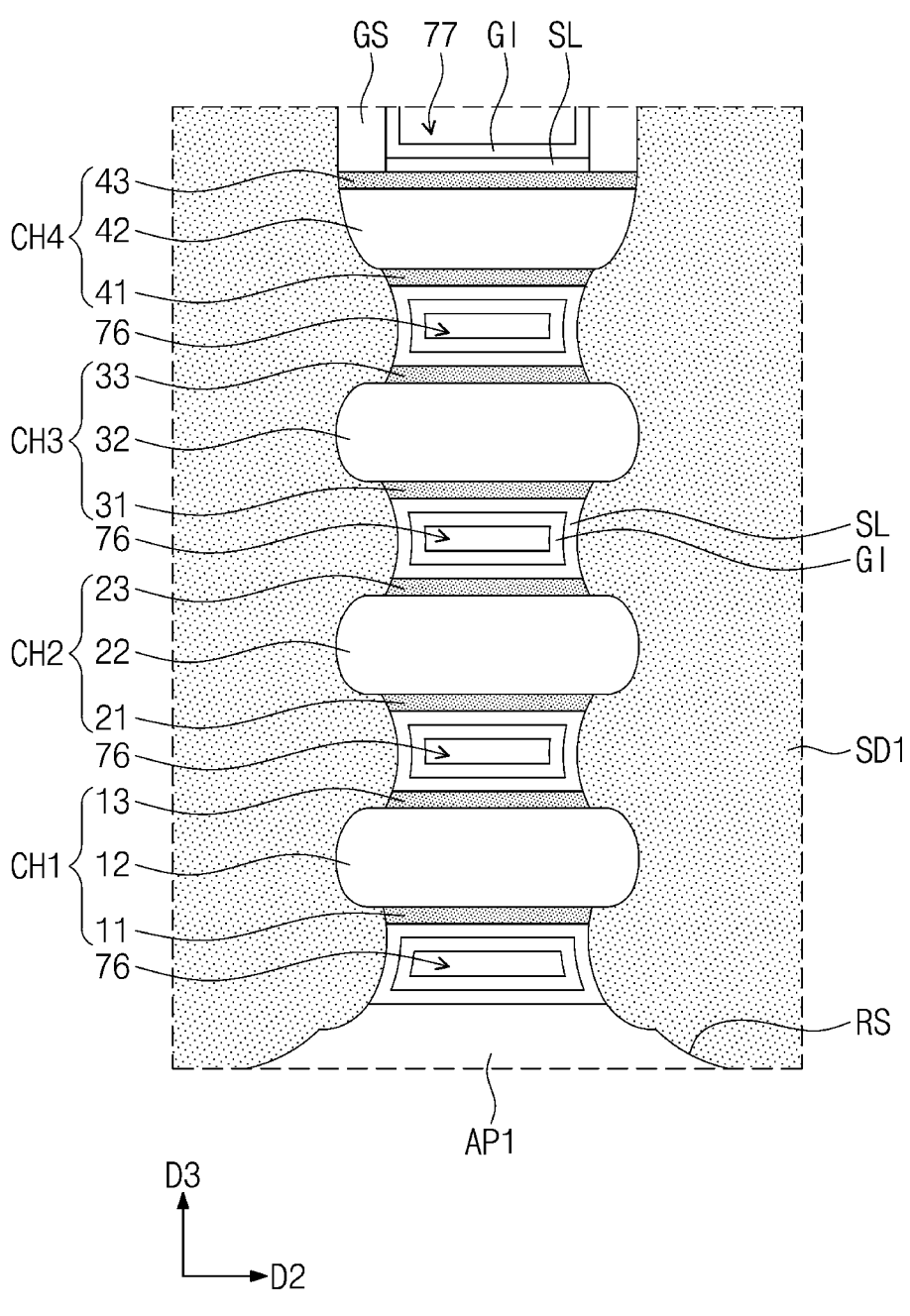
Figure 11B:
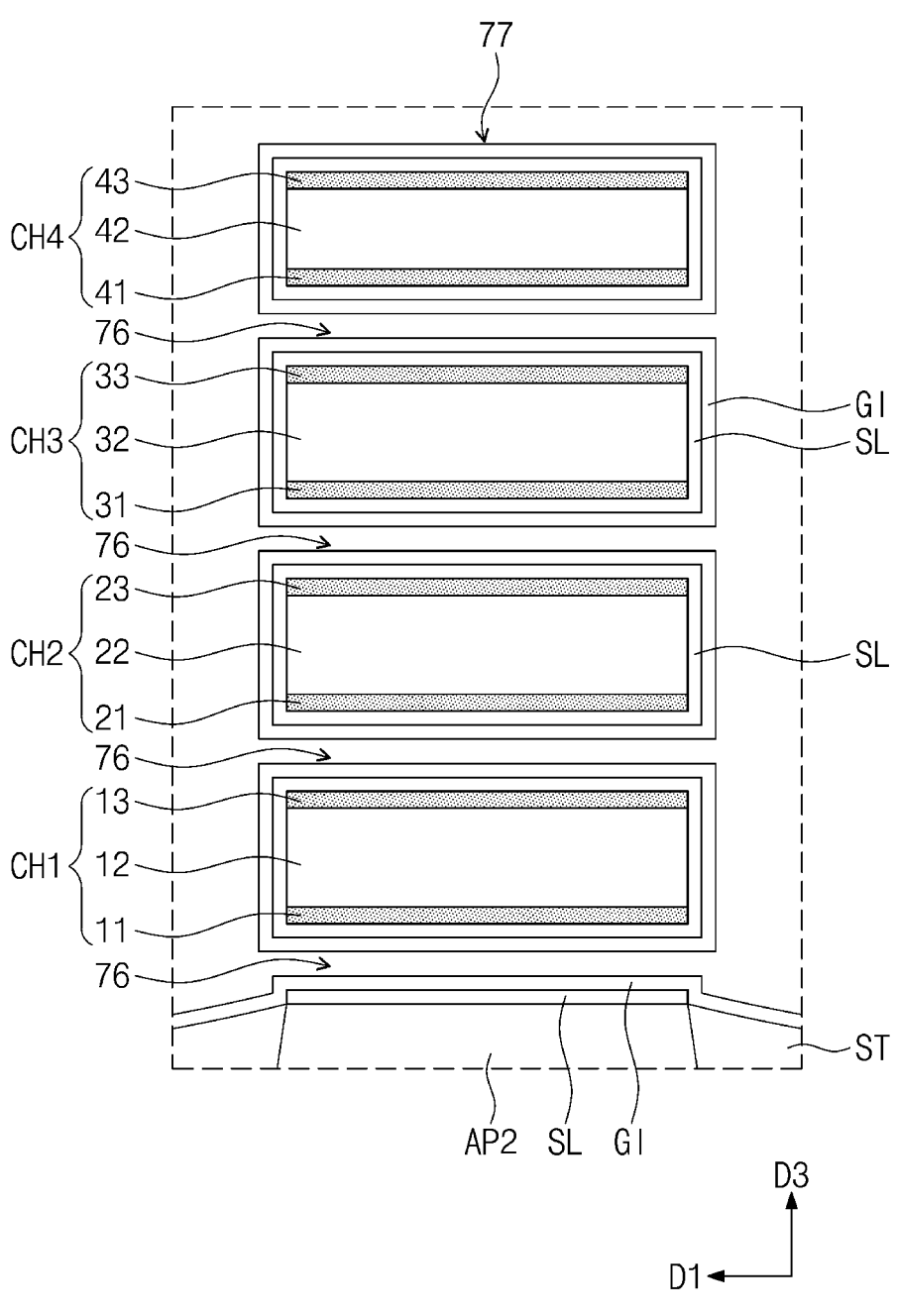

Referring to FIGS. 11A and 11B, a gate dielectric layer GI may be formed. The gate dielectric layer GI may partially fill the first space 77 and the second space 76.

Referring to FIGS. 4A to 4G, a gate electrode GE may be formed. A gate capping pattern GP and a second interlayer dielectric layer 120 may be formed. An active contact AC, an upper dielectric pattern UIP, a gate contact GC, and a separation structure DB may be formed.

A third interlayer dielectric layer 130 and a first metal layer M1 may be formed. A fourth interlayer dielectric layer 140 and a second metal layer M2 may be formed.

In a method of fabricating a semiconductor device according to some embodiments of the present inventive concept, as the semiconductor layer SL is formed by a selective epitaxial growth process, there may be an improvement in surface roughness between the semiconductor layer SL and the lower channel layers 11, 21, 31, and 41 or the upper channel layers 13, 23, 33, and 43. Therefore, a channel structure may increase in carrier mobility.

In a method of fabricating a semiconductor device according to some embodiments of the present inventive concept, as a channel structure acts as a channel of NMOSFET or a channel of PMOSFET, a source/drain pattern of NMOSFET and a source/drain pattern of PMOSFET may be formed of the same semiconductor material. Therefore, it may be possible to simultaneously form the source/drain pattern of NMOSFET and the source/drain pattern of PMOSFET and to decrease the degree of difficulty in fabricating a semiconductor device.

In a semiconductor device according to some embodiments of the present inventive concept, as a channel structure includes an upper channel structure, a lower channel layer, and an intervening channel layer, the channel structure may have relatively large carrier mobility, and the semiconductor device may have improved electrical properties.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor device, comprising:
   a substrate that includes an active pattern;
   a first channel structure that overlaps the active pattern;
   a gate electrode that includes an electrode portion disposed between the active pattern and the first channel structure;
   a semiconductor layer that is in contact with the first channel structure; and
   a source/drain pattern in contact with the first channel structure,
   wherein the first channel structure includes:
      a first upper channel layer;
      a first lower channel layer; and
      a first intervening channel layer disposed between the first upper channel layer and the first lower channel layer,
   wherein the semiconductor layer is in contact with a first upper sidewall of the first upper channel layer, a first lower sidewall of the first lower channel layer, and a first intervening sidewall of the first intervening channel layer, and
   wherein each of the semiconductor layer and the first intervening channel layer includes a semiconductor material that is different from a semiconductor material of each of the first upper channel layer and the first lower channel layer.

2. The semiconductor device of claim 1, wherein
   each of the semiconductor layer and the first intervening channel layer include silicon, and
   each of the first upper channel layer and the first lower channel layer include silicon-germanium.

3. The semiconductor device of claim 1, wherein the first upper sidewall, the first lower sidewall, and the first intervening sidewall are substantially coplanar with each other.

4. The semiconductor device of claim 1, wherein
   the first upper channel layer has a second upper sidewall that is in contact with the source/drain pattern, the first lower channel layer has a second lower sidewall that is in contact with the source/drain pattern, and the first intervening channel layer has a second intervening sidewall that is in contact with the source/drain pattern.

5. The semiconductor device of claim 4, wherein the second upper sidewall, the second lower sidewall, and the second intervening sidewall are curved.

6. The semiconductor device of claim 4, wherein the second intervening sidewall is spaced apart from the semiconductor layer.

7. The semiconductor device of claim 1, wherein a top surface of the first intervening channel layer is in contact with the source/drain pattern and a bottom surface of the first upper channel layer.

8. The semiconductor device of claim 1, wherein the semiconductor layer includes:

a first semiconductor portion that is in contact with a top surface of the active pattern;

a second semiconductor portion that is in contact with a bottom surface of the first lower channel layer; and a third semiconductor portion that connects the first semiconductor portion to the second semiconductor portion.

9. The semiconductor device of claim 8, further comprising a second channel structure that overlaps the first channel structure, wherein the second channel structure includes:

a second upper channel layer;

a second lower channel layer; and a second intervening channel layer disposed between the second upper channel layer and the second lower channel layer, wherein the semiconductor layer further includes:

a fourth semiconductor portion that is in contact with a top surface of the first upper channel layer;

a fifth semiconductor portion that is in contact with a bottom surface of the second lower channel layer; and a sixth semiconductor portion that connects the fourth semiconductor portion to the fifth semiconductor portion.

10. A semiconductor device, comprising:

a substrate that includes an active pattern;

a plurality of source/drain patterns that overlap the active pattern and are adjacent to each other;

a first channel structure disposed between the source/drain patterns;

a gate electrode that includes a first electrode portion that is disposed between the active pattern and the first channel structure; and a semiconductor layer that is in contact with the first channel structure and the source/drain patterns, wherein the first channel structure includes:

a first lower channel layer;

a first intervening channel layer disposed on a top surface of the first lower channel layer; and a first upper channel layer disposed on a top surface of the first intervening channel layer, wherein the semiconductor layer and the first intervening channel layer include a semiconductor material different from a semiconductor material of the first upper channel layer and the first lower channel layer, and wherein the first upper channel layer and the first lower channel layer are spaced apart from each other.

11. The semiconductor device of claim 10, further comprising a second channel structure disposed between the source/drain patterns, wherein the second channel structure includes:

a second lower channel layer;

a second intervening channel layer disposed on a top surface of the second lower channel layer; and a second upper channel layer disposed on a top surface of the second intervening channel layer, wherein the semiconductor layer includes:

a first semiconductor portion disposed on a top surface of the first upper channel layer;

a second semiconductor portion disposed on a bottom surface of the second lower channel layer; and a third semiconductor portion that connects the first semiconductor portion to the second semiconductor portion.

12. The semiconductor device of claim 11, wherein the gate electrode further includes a second electrode portion disposed between the first channel structure and the second channel structure, the semiconductor device further comprises a gate dielectric layer disposed between the gate electrode and the semiconductor layer, and the gate dielectric layer includes:

a first dielectric portion disposed between the first semiconductor portion and the second electrode portion;

a second dielectric portion disposed between the second semiconductor portion and the second electrode portion; and a third dielectric portion disposed between the first dielectric portion and the second dielectric portion.

13. The semiconductor device of claim 10, wherein the source/drain patterns are arranged in a first direction, a width in the first direction of the first lower channel layer is less than a width in the first direction of the first intervening channel layer, and a width in the first direction of the first upper channel layer is less than the width in the first direction of the first intervening channel layer.

14. The semiconductor device of claim 13, wherein the first lower channel layer has a first lower sidewall that extends in the first direction, the first upper channel layer has a first upper sidewall that extends in the first direction, the first intervening channel layer has a first intervening sidewall that extends in the first direction, and the first lower sidewall, the first upper sidewall, and the first intervening sidewall are substantially coplanar with each other.

15. The semiconductor device of claim 10, wherein a thickness of the first intervening channel layer is greater than each of a thickness of the first upper channel layer and a thickness of the first lower channel layer.

16. The semiconductor device of claim 10, wherein a thickness of the first intervening channel layer is greater than a thickness of the semiconductor layer.

17. The semiconductor device of claim 10, wherein each of the first upper channel layer and the first lower channel layer include at least one of boron (B), phosphorus (P), carbon (C), or arsenic (As).

18. The semiconductor device of claim 10, further comprising a pair of gate spacers disposed on opposite sides of the gate electrode, wherein the semiconductor layer includes a semiconductor portion that is in contact with sidewalls of the gate spacers.

19. The semiconductor device of claim 18, further comprising a second channel structure in contact with the semiconductor portion, wherein the second channel structure includes:

a second upper channel layer that is in contact with the semiconductor portion;

a second intervening channel layer that is in contact with a bottom surface of the second upper channel layer; and a second lower channel layer that is in contact with a bottom surface of the second intervening channel layer, wherein a width of the second upper channel layer is greater than a width of the second lower channel layer.

20. A semiconductor device, comprising:

a substrate that includes an active pattern;

a plurality of source/drain patterns that overlap the active pattern and are adjacent to each other in a first direction;

a channel structure disposed between the source/drain patterns;

a gate electrode that includes an electrode portion that is disposed between the active pattern and the channel structure;

a semiconductor layer in contact with the channel structure and the source/drain patterns;

a gate dielectric layer disposed between the gate electrode and the semiconductor layer;

an active contact electrically connected to the source/drain pattern, wherein the channel structure includes:

a lower channel layer;

an upper channel layer; and an intervening channel layer disposed between the lower channel layer and the upper channel layer, wherein each of the semiconductor layer and the intervening channel layer include silicon, wherein each of the upper channel layer and the lower channel layer include silicon-germanium, and wherein each of a width in the first direction of the upper channel layer and a width in the first direction of the lower channel layer is less than a width in the first direction of the intervening channel layer.

* * * * *